(12) United States Patent
Sakai et al.

(10) Patent No.: US 9,425,777 B2
(45) Date of Patent: Aug. 23, 2016

(54) PHASE INTERPOLATOR

(71) Applicant: FUJITSU LIMITED, Kawasaki-shi, Kanagawa (JP)

(72) Inventors: Yasufumi Sakai, Fuchu (JP); Toshihiko Mori, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/682,377

(22) Filed: Apr. 9, 2015

(65) Prior Publication Data

US 2015/0349980 A1 Dec. 3, 2015

(30) Foreign Application Priority Data

May 27, 2014 (JP) ................................. 2014-109497

(51) Int. Cl.
| | |
|---|---|
| *H04L 25/02* | (2006.01) |
| *H03K 5/13* | (2014.01) |
| *G06F 1/02* | (2006.01) |
| *H04L 27/18* | (2006.01) |
| *H04L 7/00* | (2006.01) |
| *H04L 27/00* | (2006.01) |
| *H03K 5/00* | (2006.01) |

(52) U.S. Cl.
CPC ................ *H03K 5/13* (2013.01); *G06F 1/022* (2013.01); *H03K 2005/00052* (2013.01); *H04L 7/0025* (2013.01); *H04L 27/18* (2013.01); *H04L 2027/0016* (2013.01)

(58) Field of Classification Search
CPC ...................... H03K 2005/00052; H03K 5/13; H03K 5/15; H03K 5/26; H03B 21/00; G06F 1/022; H04L 7/0025
See application file for complete search history.

(56) References Cited

U.S. PATENT DOCUMENTS

| | | | | |
|---|---|---|---|---|
| 3,663,754 A * | 5/1972 | Hanna, Jr. | ............. | H04L 27/122 375/303 |
| 3,792,478 A * | 2/1974 | Parquier | ................. | H03L 7/087 331/12 |
| 5,485,490 A * | 1/1996 | Leung | ................. | H03K 3/0231 327/144 |
| 6,188,341 B1 * | 2/2001 | Taniguchi | .......... | G01D 5/24409 341/111 |
| 6,417,712 B1 * | 7/2002 | Beards | ..................... | H03C 3/40 327/231 |
| 7,756,491 B2 * | 7/2010 | Kee | ........................ | H03F 1/3282 455/114.3 |
| 7,889,812 B2 * | 2/2011 | Trager | .................. | G06F 1/0335 341/144 |
| 9,001,953 B2 * | 4/2015 | Katoh | .................... | H03H 11/20 375/371 |
| 2006/0208784 A1 * | 9/2006 | Suzuki | ..................... | H03K 5/13 327/231 |
| 2007/0147564 A1 * | 6/2007 | Fan | ........................ | H03H 11/16 375/355 |
| 2008/0074154 A1 * | 3/2008 | Shin | ....................... | H03B 21/00 327/105 |
| 2009/0028216 A1 * | 1/2009 | Gresham | ................. | G01S 7/282 375/130 |
| 2009/0179674 A1 * | 7/2009 | Tamura | ..................... | H03K 5/13 327/155 |
| 2011/0102028 A1 * | 5/2011 | Nedachi | .................... | H03K 5/13 327/144 |
| 2012/0155142 A1 * | 6/2012 | King | ....................... | H03H 11/16 365/63 |

FOREIGN PATENT DOCUMENTS

| | | |
|---|---|---|
| JP | 11-194926 | 7/1999 |
| JP | 2000-112715 | 4/2000 |

* cited by examiner

*Primary Examiner* — Sophia Vlahos

(74) *Attorney, Agent, or Firm* — Fujitsu Patent Center

(57) ABSTRACT

A phase interpolator has: a mixer configured to synthesize phases of a plurality of input cosine-wave or sine-wave signals whose phases are different from each other; and a bias generator configured to output a bias signal in accordance with a phase control signal to the mixer, and the mixer outputs a signal with a phase in accordance with the phase control signal.

12 Claims, 10 Drawing Sheets

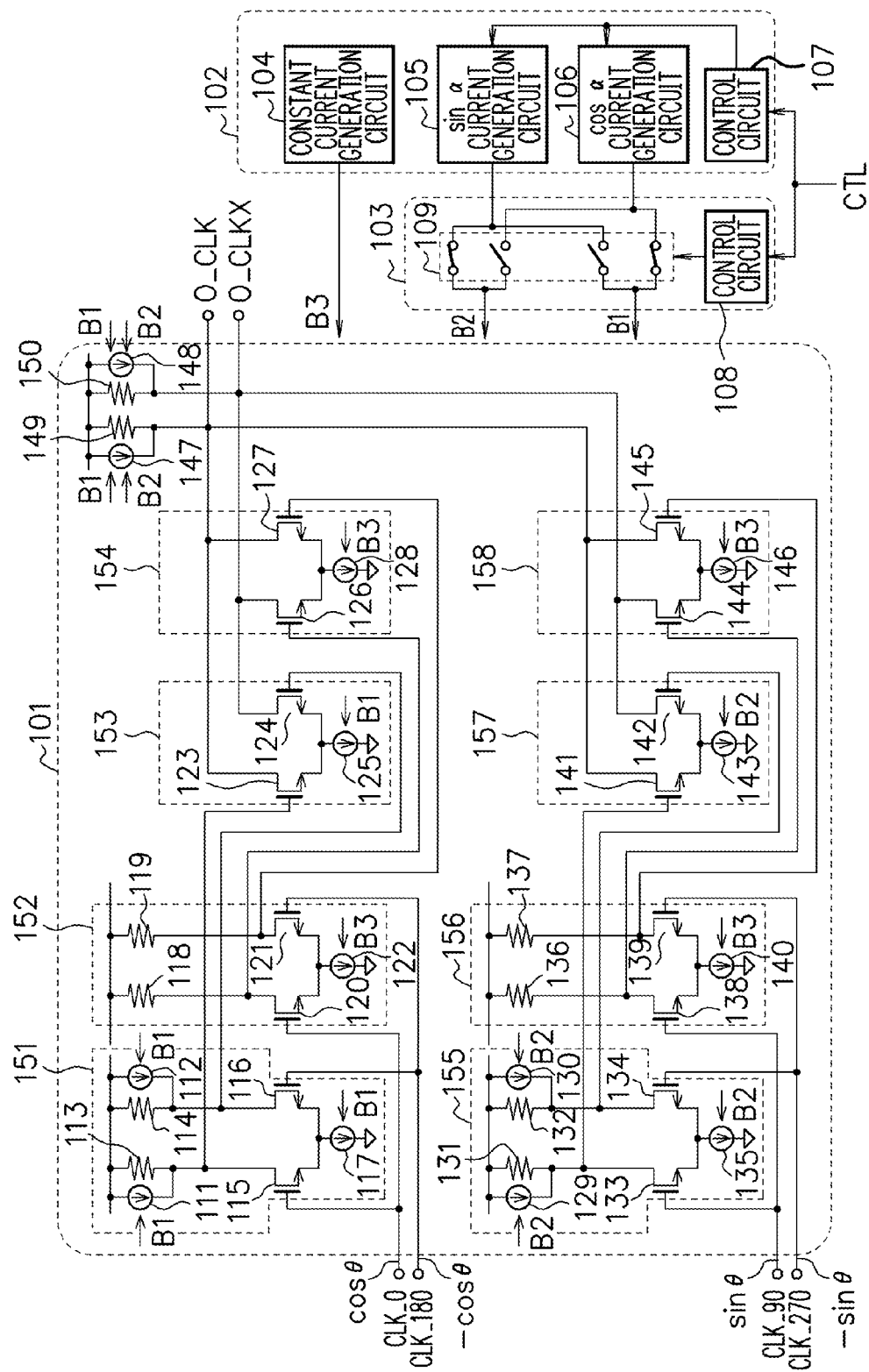
F I G. 1

F I G. 5
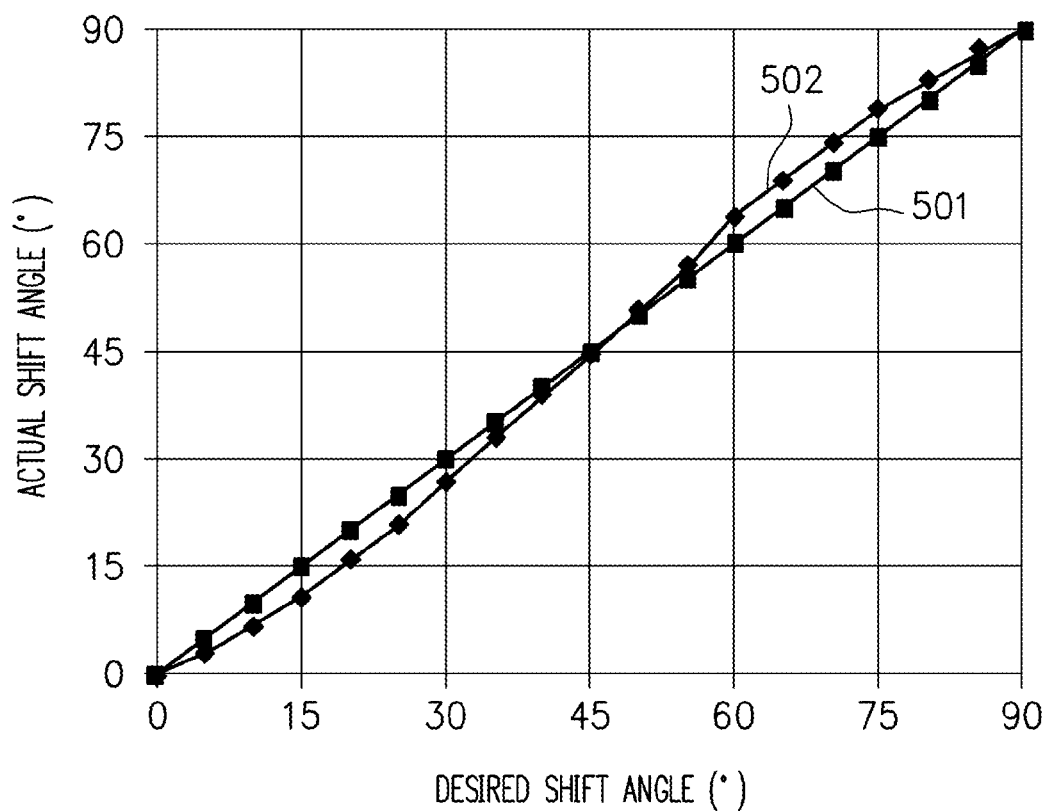

PHASE INTERPOLATOR

CROSS-REFERENCE TO RELATED APPLICATION

This application is based upon and claims the benefit of priority of the prior Japanese Patent Application No. 2014-109497, filed on May 27, 2014, the entire contents of which are incorporated herein by reference.

FIELD

The embodiments discussed herein are directed to a phase interpolator.

BACKGROUND

A trigonometric function computing unit which finds a sine value and a cosine value of numerical data has been known (refer to Patent Document 1). A storage device stores an initial sine value $\sin \theta_0$ and an initial cosine value $\cos \theta_0$ as initial numerical values $\theta_0$. The trigonometric function computing unit finds the sine value and the cosine value of the input numerical data by the following expressions, from the initial sine value $\sin \theta_0$ and the initial cosine value $\cos \theta_0$, which are stored in the storage device, and differences $\Delta\theta (\Delta\theta=\theta-\theta_0)$ between the input numerical data $\theta$ and the initial numerical values $\theta_0$.

$$\sin \theta = \sin \theta_0 \cdot \cos \theta\Delta + \cos \theta_0 \cdot \sin \theta\Delta$$

$$\cos \theta = \cos \theta_0 \cdot \cos \theta\Delta - \sin \theta_0 \cdot \sin \theta\Delta$$

Further, there has been known a sine/cosine arithmetic circuit having an absolute value/sign extraction circuit which outputs an absolute value signal of an input phase angle signal and a positive/negative sign signal of the phase angle signal (refer to Patent Document 2). A sine/cosine approximation arithmetic circuit performs an approximation operation of sine operation results and cosine operation results in a predetermined limited quadrant by using a primary approximation operation expression, based on a predetermined less significant bit in the absolute value signal output by the absolute value/sign extraction circuit. According to three significant bits of the positive/negative sign signal and the absolute value signal which are output by the absolute value/sign extraction circuit, a phase rotation processing circuit replaces the sine operation results and the cosine operation results which are output by the sine/cosine approximation arithmetic circuit, and changes signs to thereby output sine operation results and cosine operation results in a quadrant other than the predetermined limited quadrant.

Patent Document 1: Japanese Laid-open Patent Publication No. 11-194926

Patent Document 2: Japanese Laid-open Patent Publication No. 2000-112715

In recent years, performance, especially a bandwidth, of components such as a central processing unit (CPU) constituting an information processing system such as a server and a computer has been greatly improved. Accordingly, in order to improve the total bandwidth of the whole information processing system, it is necessary to increase the speed of a transmission/reception circuit which transmits/receives data to/from the component such as the CPU.

As a method to increase the speed of the transmission/reception circuit, there has been known a method which uses a phase interpolator for the generation of a clock signal of the transmission/reception circuit. Generally, a noise component is superimposed on a data signal that the transmission/reception circuit processes. Here, the use of the phase interpolator for the generation of the clock signal that decides the timing of data processing makes it possible to set the processing timing of the data signal (phase of the clock signal) to an optimum value, and accordingly, can reduce an influence of the noise component superimposed on the data signal.

As a method to increase the speed of the transmission/reception circuit, there has been known a method to increase a frequency of a clock signal of the transmission/reception circuit. However, when a frequency of a square-wave clock signal input to a phase interpolator is increased, phase linearity of the phase interpolator deteriorates. When the frequency of the clock signal is increased, the square-wave clock signal is distorted due to an influence of parasitic capacitance or the like existing in a wiring line in the circuit. When the distorted square-wave clock signal is input to the phase interpolator, phase linearity of the phase interpolator deteriorates.

SUMMARY

A phase interpolator includes: a mixer configured to synthesize phases of a plurality of cosine-wave or sine-wave input signals whose phases are different from each other; and a bias generator configured to output a bias signal in accordance with a phase control signal to the mixer, and the mixer outputs a signal with a phase in accordance with the phase control signal.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 1 is a diagram illustrating a configuration example of a phase interpolator according to a first embodiment;

FIG. 5 is a chart illustrating phase characteristics of the phase interpolators;

DESCRIPTION OF EMBODIMENTS

First Embodiment

Figure 2:
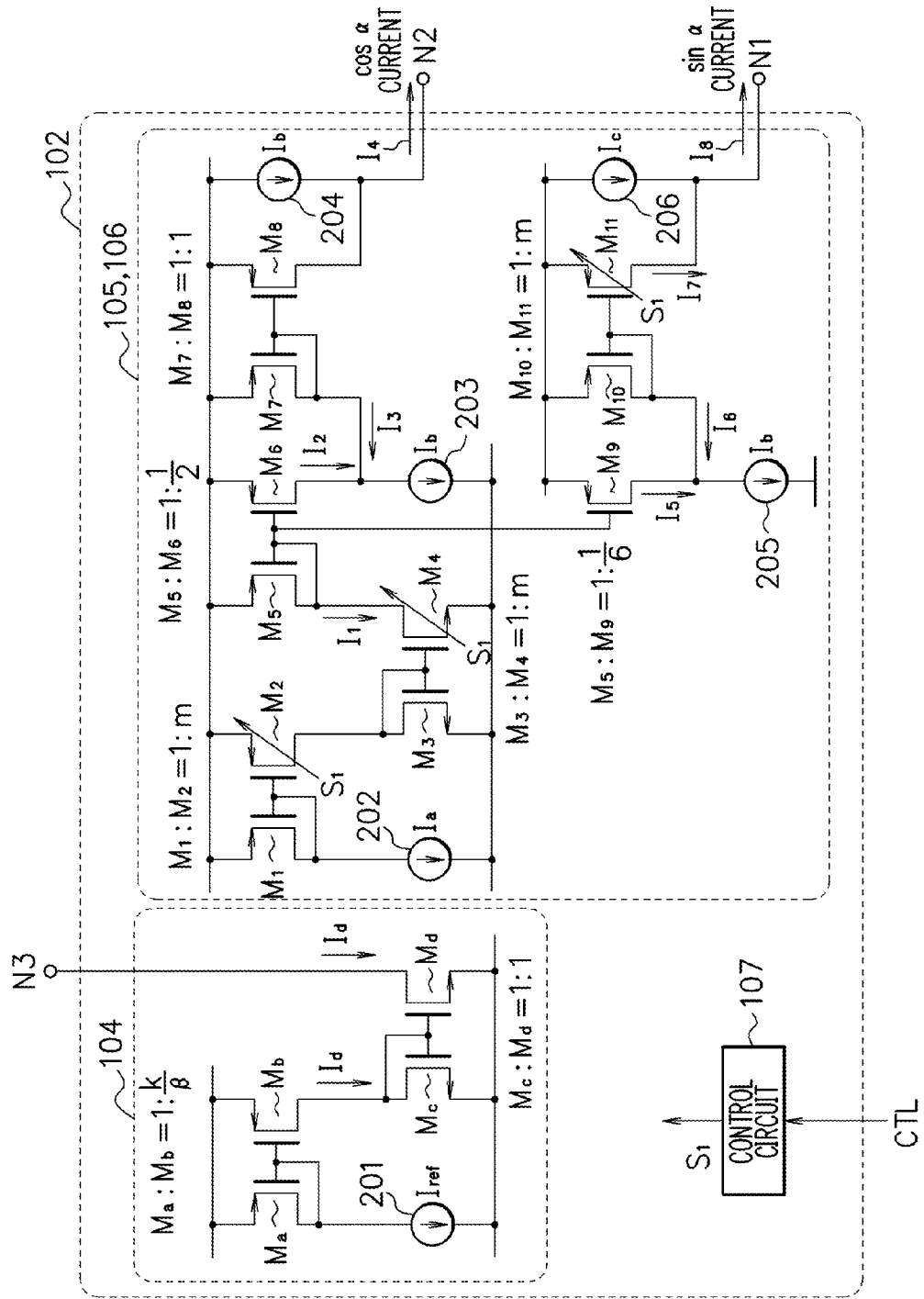
FIG. 2 is a diagram illustrating a configuration example of a bias generator in FIG. 1.

FIG. 1 is a diagram illustrating a configuration example of a phase interpolator according to a first embodiment. The phase interpolator is capable of generating a clock signal of a transmission/reception circuit. A noise component is superimposed on a data signal that the transmission/reception circuit processes. By generating the clock signal that decides the timing of data processing, the phase interpolator is capable of setting the processing timing of the data signal (phase of the clock signal) to an optimum value to reduce an influence of the noise component superimposed on the data signal.

The phase interpolator has a mixer 101, a bias generator 102, and a bias selector 103. The mixer 101 has a first differential pair 151, a second differential pair 152, a third differential pair 153, a fourth differential pair 154, a fifth differential pair 155, a sixth differential pair 156, a seventh differential pair 157, an eighth differential pair 158, current sources 147, 148, and resistors 149, 150.

The first differential pair 151 has current sources 111, 112, resistors 113, 114, n-channel field effect transistors 115, 116, and a tail current source 117. The current source 111 is connected between a power supply potential node and a drain of the n-channel field effect transistor 115. The resistor 113 is connected to the current source 111 in parallel. The n-channel field effect transistor 115 has a gate connected to a first input terminal CLK_0 and a source connected to a ground potential node via the tail current source 117. The current source 112 is connected between the power supply potential node and a drain of the n-channel field effect transistor 116. The resistor 114 is connected to the current source 112 in parallel. The n-channel field effect transistor 116 has a gate connected to a second input terminal CLK_180 and a source connected to the ground potential node via the tail current source 117. In each of the current sources 111 and 112, a current based on a bias signal B1 flows. In the tail current source 117, a tail current based on the bias signal B1 flows. A parallel-connection circuit of the current source 111 and the resistor 113 and a parallel-connection circuit of the current source 112 and the resistor 114 are loads of the first differential pair 151.

The second differential pair 152 has resistors 118, 119, n-channel field effect transistors 120, 121, and a tail current source 122. The resistor 118 is connected between the power supply potential node and a drain of the n-channel field effect transistor 120. The n-channel field effect transistor 120 has a gate connected to the first input terminal CLK_0 and a source connected to the ground potential node via the tail current source 122. The resistor 119 is connected between the power supply potential node and a drain of the n-channel field effect transistor 121. The n-channel field effect transistor 121 has a gate connected to the second input terminal CLK_180 and a source connected to the ground potential node via the tail current source 122. In the tail current source 122, a tail current based on a bias signal B3 flows. The resistors 118 and 119 are loads of the second differential pair 152.

The third differential pair 153 has n-channel field effect transistors 123, 124 and a tail current source 125. The n-channel field effect transistor 123 has a drain connected to a first output terminal O_CLK, a gate connected to the drain of the n-channel field effect transistor 115, and a source connected to the ground potential node via the tail current source 125. The n-channel field effect transistor 124 has a drain connected to a second output terminal O_CLKX, a gate connected to the drain of the n-channel field effect transistor 116, and a source connected to the ground potential node via the tail current source 125. In the tail current source 125, a tail current based on the bias signal B1 flows.

The fourth differential pair 154 has n-channel field effect transistors 126, 127 and a tail current source 128. The n-channel field effect transistor 126 has a drain connected to the second output terminal O_CLKX, a gate connected to the drain of the n-channel field effect transistor 120, and a source connected to the ground potential node via the tail current source 128. The n-channel field effect transistor 127 has a drain connected to the first output terminal O_CLK, a gate connected to the drain of the n-channel field effect transistor 121, and a source connected to the ground potential node via the tail current source 128. In the tail current source 128, a tail current based on the bias signal B3 flows.

The fifth differential pair 155 has current sources 129, 130, resistors 131, 132, n-channel field effect transistors 133, 134, and a tail current source 135. The current source 129 is connected between the power supply potential node and a drain of the n-channel field effect transistor 133. The resistor 131 is connected to the current source 129 in parallel. The n-channel field effect transistor 133 has a gate connected to a third input terminal CLK_90 and a source connected to the ground potential node via the tail current source 135. The current source 130 is connected between the power supply potential node and a drain of the n-channel field effect transistor 134. The resistor 132 is connected to the current source 130 in parallel. The n-channel field effect transistor 134 has a gate connected to a fourth input terminal CLK_270 and a source connected to the ground potential node via the tail current source 135. In each of the current sources 129 and 130, a current based on a bias signal B2 flows. In the tail current source 135, a tail current based on the bias signal B2 flows. A parallel-connection circuit of the current source 129 and the resistor 131 and a parallel-connection circuit of the current source 130 and the resistor 132 are loads of the fifth differential pair 155.

The sixth differential pair 156 has resistors 136, 137, n-channel field effect transistors 138, 139, and a tail current source 140. The resistor 136 is connected between the power supply potential node and a drain of the n-channel field effect transistor 138. The n-channel field effect transistor 138 has a gate connected to the third input terminal CLK_90 and a source connected to the ground potential node via the tail current source 140. The resistor 137 is connected between the power supply potential node and a drain of the n-channel field effect transistor 139. The n-channel field effect transistor 139 has a gate connected to the fourth input terminal CLK_270 and a source connected to the ground potential node via the tail current source 140. In the tail current source 140, a tail current based on the bias signal B3 flows. The resistors 136 and 137 are loads of the sixth differential pair 156.

The seventh differential pair 157 has n-channel field effect transistors 141, 142 and a tail current source 143. The n-channel field effect transistor 141 has a drain connected to the first output terminal O_CLK, a gate connected to the drain of the n-channel field effect transistor 133, and a source connected to the ground potential node via the tail current source 143. The n-channel field effect transistor 142 has a drain connected to the second output terminal O_CLKX, a gate connected to the drain of the n-channel field effect transistor 134, and a source connected to the ground potential node via the tail current source 143. In the tail current source 143, a tail current based on the bias signal B2 flows.

The eighth differential pair 158 has n-channel field effect transistors 144, 145 and a tail current source 146. The n-channel field effect transistor 144 has a drain connected to the second output terminal O_CLKX, a gate connected to the drain of the n-channel field effect transistor 138, and a source connected to the ground potential node via the tail current source 146. The n-channel field effect transistor 145 has a drain connected to the first output terminal O_CLK, a gate connected to the drain of the n-channel field effect transistor 139, and a source connected to the ground potential node via the tail current source 146. In the tail current source 146, a tail current based on the bias signal B3 flows.

The current source 147 is connected between the power supply potential node and the first output terminal O_CLK. The resistor 149 is connected to the current source 147 in parallel. The current source 148 is connected between the power supply potential node and the second output terminal O_CLKX. The resistor 150 is connected to the current source 148 in parallel. In each of the current sources 147 and 148, currents based on the bias signals B1 and B2 flow. A parallel-connection circuit of the current source 147 and the resistor 149 and a parallel-connection circuit of the current source 148 and the resistor 150 are loads commonly connected to the third differential pair 153, the fourth differential pair 154, the seventh differential pair 157, and the eighth differential pair 158.

The bias generator 102 has a constant current generation circuit 104, a sin α current generation circuit 105, a cos α current generation circuit 106, and a control circuit 107, and receives a phase control signal CTL. The constant current generation circuit 104 outputs the bias signal B3 for applying a constant current, to the current sources 122, 128, 140, 146. In the current sources 122, 128, 140, 146, the constant current flows. The control circuit 107 controls the sin α current generation circuit 105 and the cos α current generation circuit 106 according to the phase control signal CTL. The sin α current generation circuit 105 outputs a bias signal for applying a current with a sine value sin α. The cos α current generation circuit 106 outputs a bias signal for applying a current with a cosine value cos α.

The bias selector 103 has a control circuit 108 and a switch circuit 109 and receives the phase control signal CTL. The control circuit 108 controls the switch circuit 109 according to the phase control signal CTL. The switch circuit 109 outputs the bias signals output by the sin α current generation circuit 105 and the cos α current generation circuit 106, as the bias signals B1 and B2.

An input signal with a cosine wave cos θ is input to the first input terminal CLK_0. An input signal with a cosine wave −cos θ is input to the second input terminal CLK_180. An input signal with a sine wave sin θ is input to the third input terminal CLK_90. An input signal with a sine wave −sin θ is input to the fourth input terminal CLK_270. The four input cosine-wave or sine-wave signals whose phases are different by 90 degrees from one another are input to the four input terminals CLK_0 to CLK_270 respectively. The mixer 101 synthesizes the phases of the four cosine-wave or sine-wave input signals with the different phases input to the four input terminals CLK_0 to CLK_270 and outputs a differential signal having a phase according to the phase control signal CTL to the first output terminal O_CLK and the second output terminal O_CLKX. The bias generator 102 outputs the bias signals B1 to B3 according to the phase control signal CTL to the mixer 101.

The first differential pair 151 receives the input signals of the first input terminal CLK_0 and the second input terminal CLK_180. The second differential pair 152 receives the input signals of the first input terminal CLK_0 and the second input terminal CLK_180. The third differential pair 153 receives an output signal of the first differential pair 151 and outputs a signal to the first output terminal O_CLK and the second output terminal O_CLKX. The fourth differential pair 154 receives an output signal of the second differential pair 152 and outputs a signal to the second output terminal O_CLKX and the first output terminal O_CLK. The fifth differential pair 155 receives the input signals of the third input terminal CLK_90 and the fourth input terminal CLK_270. The sixth differential pair 156 receives the input signals of the third input terminal CLK_90 and the fourth input terminal CLK_270. The seventh differential pair 157 receives an output signal of the fifth differential pair 155 and outputs a signal to the first output terminal O_CLK and the second output terminal O_CLKX. The eighth differential pair 158 receives an output signal of the sixth differential pair 156 and outputs a signal to the second output terminal O_CLKX and the first output terminal O_CLK.

The mixer 101 performs the phase synthesis based on an addition theorem of a trigonometric function of the following expression (1).

[expression 1]

$$\cos\theta \cdot \cos\alpha + \cos\left(\theta - \frac{\pi}{2}\right) \cdot \sin\alpha = \cos\theta \cdot \cos\alpha + \sin\theta \cdot \sin\alpha \quad (1)$$
$$= \cos(\theta - \alpha)$$

Here, let us consider synthesizing two signals with a cosine wave cos θ and a sine wave sine whose phases are shifted by 90 degrees. An amplitude of the cosine wave cos θ is multiplied by a weight of a cosine value cos α of a desired shift angle (phase) α, whereby a cos θ·cos α signal is generated. Further, an amplitude of the sine wave sin θ is multiplied by a weight of a sine value sin α of the desired shift angle (phase) α, whereby a sin θ·sin α signal is generated. Thereafter, by adding the cos θ·cos α signal and the sin θ·sin α signal, it is possible to generate a cos(θ−α) signal having a phase shifted from that of cos θ by α is generated as expressed by the expression (1) according to the addition theorem of the triangular function, to output it to the output terminals O_CLK and O_CLKX. That is, it is possible for the signal at the output terminal O_CLK to have the phase shifted by α from the phase of the signal at the input terminal CLK_0. Further, the input signals are the cosine wave and the sine wave, and therefore are less likely to be influenced by parasitic capacitance than a square wave. Therefore, even when frequencies of the input signals are increased, it is possible to prevent the deterioration of phase linearity of the phase interpolator. Hereinafter, details thereof will be described.

The first to fourth differential pairs 151 to 154 generate the cos θ·cos α signal for the output terminals O_CLK and O_CLKX. The fifth to eighth differential pairs 155 to 158 generate the sin θ·sin α signal for the output terminals O_CLK and O_CLKX. At the output terminals O_CLK and O_CLKX, the cos θ·cos α signal and the sin θ·sin α signal are added, whereby the cos(θ−α) signal is generated.

In each of the tail current sources 117 and 125, a current $I_{11}$ having the cosine weight flows due to the bias signal B1 being a current with the cosine value cos α, as expressed by the following expression (2). Further, in each of the tail current sources 122, 128, 140, and 146, a constant current $I_{12}$ expressed by the following expression (2) flows.

[expression 2]

$$I_{11} = \frac{k}{\beta}(1 + \cos\alpha) \quad (2)$$

$$I_{12} = \frac{k}{\beta}$$

Here, β is β of each of the input-stage transistors 115, 116, 120, 121, 123, 124, 126, 127, 133, 134, 138, 139, 141, 142, 144, 145 of the differential pairs 151 to 158. α is a desired shift angle. k is an arbitrary constant.

First, an operation of the first differential pair 151 will be described. In the tail current source 117 of the first differential pair 151, the current $I_{11}$ expressed by the expression (2) flows. Therefore, in each of the input-stage transistors 115 and 116 of the first differential pair 151, a bias current $I_{11}/2$ which is a half of the current $I_{11}$ flowing in the tail current source 117 flows. Here, mutual conductance $g_m$ of the transistors 115 and 116 in saturated operation is expressed by the following expression (3).

[expression 3]

$$g_m = \sqrt{2\beta I_{dr}} \quad (3)$$

Here, $I_{dr}$ is a drain current of the transistors 115 and 116. Therefore, mutual conductance $g_{m1}$ of the input-stage transistor 115 of the first differential pair 151 has a value correlated with the desired shift angle α as expressed by the following expression (4). Further, since the cosine wave cos θ is input to the gate of the transistor 115, a drain current $i_{o1}$ flowing in the transistor 115 has a value equal to a square root of the cosine value cos α of the desired shift angle α multiplied by the cosine wave cos θ, as expressed by the following expression (4). Further, a voltage $v_{o1}$ of the drain of the transistor 115 has a value equal to an output impedance $Z_{o1}$ of the first differential pair 151 multiplied by the current $i_{o1}$, as expressed by the following expression (4).

[expression 4]

$$g_{m1} = \sqrt{2\beta \cdot \frac{I_{11}}{2}} = \sqrt{\beta \cdot I_{11}} = \sqrt{k(1+\cos\alpha)} \quad (4)$$

$$i_{o1} = -g_{m1} \cdot v_{in} = -\sqrt{k(1+\cos\alpha)} \cdot \cos\theta$$

$$v_{o1} = Z_{o1} \cdot i_{o1} = -Z_{o1} \cdot \sqrt{k(1+\cos\alpha)} \cdot \cos\theta$$

Incidentally, in the current sources 111 and 112 being the loads connected to the first differential pair 151, a current $I_{11}/2$ which is a half of the current $I_{11}$ flowing in the tail current source 117 flows. This has an advantage that, even when a value of the desired shift angle α is changed, a current value of the current sources 111 and 112 being the loads also changes according to a change of the tail current, and therefore an output operating point does not fluctuate.

Next, an operation of the second differential pair 152 will be described. In the tail current source 122 of the second differential pair 152, the current $I_{12}$ expressed by the expression (2) flows. Therefore, in the input-stage transistor 121 of the second differential pair 152, a bias current $I_{12}/2$ flows, and mutual conductance $g_{m2}$ of the input-stage transistor 121 of the second differential pair 152 has a value equal to a square root of the arbitrary constant k as expressed by the following expression (5). Therefore, a drain current $i_{o2}$ and a drain voltage $v_{o2}$ of the transistor 121 have values expressed by the following expressions (5) respectively.

[expression 5]

$$g_{m2} = \sqrt{2\beta \cdot \frac{I_{12}}{2}} = \sqrt{\beta \cdot I_{12}} = \sqrt{k} \quad (5)$$

$$i_{o2} = -g_{m2} \cdot v_{in} = \sqrt{k} \cdot \cos\theta$$

$$v_{o2} = Z_{o2} \cdot i_{o2} = Z_{o2} \cdot \sqrt{k} \cdot \cos\theta$$

Here, $Z_{o2}$ is an output impedance of the second differential pair 151. Note that values of the output impedance $Z_{o1}$ of the first differential pair 151 and the output impedance $Z_{o2}$ of the second differential pair 152 are equal, that is, $Z_{o1} = Z_{o2}$.

Next, an operation of the third differential pair 153 will be described. In the tail current source 125 of the third differential pair 153, the same current $I_{11}$ as that of the tail current source 117 of the first differential pair 151 flows. Therefore, mutual conductance $g_{m3}$ of the input-stage transistor 123 of the third differential pair 153 has the same value as that of the mutual conductance $g_{m1}$ of the input-stage transistor 115 of the first differential pair 151, as expressed by the following expression (6). Further, since a gate voltage of the input-stage transistor 123 of the third differential pair 153 is equal to the drain voltage $v_{o1}$ of the input-stage transistor 115 of the first differential pair 151, a drain current $i_{o3}$ of the input-stage transistor 123 of the third differential pair 153 has a value proportional to a value equal to the cosine weight cos α of the desired shift angle α multiplied by the cosine wave cos θ, as expressed by the following expression (6).

[expression 6]

$$g_{m3} = g_{m1} = \sqrt{k(1+\cos\alpha)}$$

$$i_{o3} = -g_{m3} \cdot v_{o1} = Z_{o1} \cdot k \cdot (1+\cos\alpha) \cdot \cos\theta \quad (6)$$

Next, an operation of the fourth differential pair 154 will be described. In the tail current source 128 of the fourth differential pair 154, the same current $I_{12}$ as that of the tail current source 122 of the second differential pair 152 flows. Therefore, mutual conductance $g_{m4}$ of the input-stage transistor 127 of the fourth differential pair 154 has the same value as that of the mutual conductance $g_{m2}$ of the input-stage transistor 121 of the second differential pair 152 as expressed by the following expression (7). Further, since a gate voltage of the input-stage transistor 127 of the fourth differential pair 154 is equal to the drain voltage $v_{o2}$ of the input-stage transistor 121 of the second differential pair 152, a drain current $i_{o4}$ of the input-stage transistor 127 of the fourth differential pair 154 has a value proportional to the cosine wave cos θ, as expressed by the following expression (7).

[expression 7]

$$g_{m4} = g_{m2} = \sqrt{k}$$

$$i_{o4} = -g_{m4} \cdot v_{o2} = -Z_{o2} \cdot k \cdot \cos\theta \quad (7)$$

Here, since the drain of the input-stage transistor 123 of the third differential pair 153 and the drain of the input-stage transistor 127 of the fourth differential pair 154 are connected by the first output terminal O_CLK, the third differential pair 153 and the fourth differential pair 154 add the current $i_{o3}$ of the third differential pair 153 and the current $i_{o4}$ of the fourth differential pair 154 to output, to the first output terminal O_CLK, a current $i_{o3}+i_{o4}$ proportional to cos θ·cos α as expressed by the following expression (8).

[expression 8]

$$i_{o3} + i_{o4}$$
$$= Z_{o1} \cdot k \cdot (1 + \cos\alpha) \cdot \cos\theta - Z_{o2} \cdot k \cdot \cos\theta$$
$$= Z_{o1} \cdot k \cdot \cos\alpha \cdot \cos\theta$$

(8)

Next, operations of the fifth differential pair 155 to the eighth differential pair 158 will be described. In each of the tail current sources 135 and 143, a current $I_{13}$ expressed by the following expression (9) flows due to the bias signal B2 having the weight of the sine value sin α. Further, in each of the current sources 140 and 146, the constant current $I_{12}$ expressed by the following expression (9) flows.

[expression 9]

$$I_{13} = \frac{k}{\beta}(1 + \sin\alpha)$$

$$I_{12} = \frac{k}{\beta}$$

(9)

Here, β is β of each of the input-stage transistors 115, 116, 120, 121, 123, 124, 126, 127, 133, 134, 138, 139, 141, 142, 144, 145 of the differential pairs 151 to 158. α is the desired shift angle. k is the arbitrary constant.

First, the operation of the fifth differential pair 155 will be described. In the tail current source 135 of the fifth differential pair 155, the current $I_{13}$ expressed by the expression (9) flows due to the bias signal B2. Therefore, in the input-stage transistor 133 of the fifth differential pair 155, a bias current $I_{13}/2$ flows. Therefore, mutual conductance $g_{m5}$ of the input-stage transistor 133 of the fifth differential pair 155 has a value correlated with the desired shift angle α as expressed by the following expression (10). Further, since the sine wave sinθ is input to the gate of the input-stage transistor 133 of the fifth differential pair 155, a drain current $i_{o5}$ of the input-stage transistor 133 has a value equal to a square root of the weight of the sine value sin α of the desired shift angle α multiplied by the sine wave sin θ, as expressed by the following expression (10). Further, a drain voltage $v_{o5}$ of the input-stage transistor 133 has a value equal to an output impedance $Z_{o5}$ of the fifth differential pair 155 multiplied by the drain current $i_{o5}$ as expressed by the following expression (10).

[expression 10]

$$g_{m5} = \sqrt{2\beta \cdot \frac{I_{13}}{2}} = \sqrt{\beta \cdot I_{13}} = \sqrt{k(1 + \sin\alpha)}$$

$$i_{o5} = -g_{m5} \cdot v_{in} = -\sqrt{k(1 + \sin\alpha)} \cdot \sin\theta$$

$$v_{o5} = Z_{o5} \cdot i_{o5} = -Z_{o5} \cdot \sqrt{k(1 + \sin\alpha)} \cdot \sin\theta$$

(10)

Note that, in each of the current sources 129 and 130 being the loads connected to the fifth differential pair 155, a current $I_{13}/2$ which is a half of the current $I_{13}$ flowing in the tail current source 135 flows. Consequently, even when the value of the desired shift angle α is changed, a current value of the current sources 129 and 130 being the loads also changes according to a change of the tail current, and therefore, an output operating point does not fluctuate.

Next, the operation of the sixth differential pair 156 will be described. In the tail current source 140 of the sixth differential pair 156, the current $I_{12}$ expressed by the above expression (9) flows. Therefore, in the input-stage transistor 139 of the sixth differential pair 156, a bias current $I_{12}/2$ flows, and mutual conductance $g_{m6}$ of the input-stage transistor 139 of the sixth differential pair 156 has a value equal to a square root of the arbitrary constant k as expressed by the following expression (11). Therefore, a drain current $i_{o6}$ and a drain voltage $v_{o6}$ of the input-stage transistor 139 of the sixth differential pair 156 have values expressed by the following expressions (11) respectively.

[expression 11]

$$g_{m6} = \sqrt{2\beta \cdot \frac{I_{12}}{2}} = \sqrt{\beta \cdot I_{12}} = \sqrt{k}$$

$$i_{o6} = -g_{m6} \cdot v_{in} = \sqrt{k} \cdot \sin\theta$$

$$v_{o6} = Z_{o6} \cdot i_{o6} = Z_{o6} \cdot \sqrt{k} \cdot \sin\theta$$

(11)

Here, $Z_{o6}$ is an output impedance of the sixth differential pair 156. Note that a value of the output impedance $Z_{o5}$ of the fifth differential pair 155 is equal to a value of the output impedance $Z_{o6}$ of the sixth differential pair 156 and is also equal to the value of the output impedance $Z_{o1}$ of the first differential pair 151, that is, $Z_{o5}=Z_{o6}=Z_{o1}$ holds.

Next, the operation of the seventh differential pair 157 will be described. In the tail current source 143 of the seventh differential pair 157, the same current $I_{13}$ as that of the tail current source 135 of the fifth differential pair 155 flows. Therefore, mutual conductance $g_{m7}$ of the input-stage transistor 141 of the seventh differential pair 157 has the same value as that of the mutual conductance $g_{m5}$ of the input-stage transistor 133 of the fifth differential pair 155 as expressed by the following expression (12). Further, since a gate voltage of the input-stage transistor 141 of the seventh differential pair 157 is equal to the drain voltage $v_{o5}$ of the input-stage transistor 133 of the fifth differential pair 155, a drain current $i_{o7}$ of the input-stage transistor 141 of the seventh differential pair 157 has a value proportional to a value equal to the sine value sin α of the desired shift angle α multiplied by the sine wave sin θ, as expressed by the following expression (12).

[expression 12]

$$g_{m7} = g_{m5} = \sqrt{k(1+\sin\alpha)}$$

$$i_{o7} = -g_{m7} \cdot v_{o5} = Z_{o5} \cdot k \cdot (1+\sin\alpha) \cdot \sin\theta$$

(12)

Next, the operation of the eighth differential pair 158 will be described. In the tail current source 146 of the eighth differential pair 158, the same current $I_{12}$ as that of the tail current source 140 of the sixth differential pair 156 flows. Therefore, mutual conductance $g_{m8}$ of the input-stage transistor 145 of the eighth differential pair 158 has the same value as that of the mutual conductance $g_{m6}$ of the input-stage transistor 139 of the sixth differential pair 156 as expressed by the following expression (13). Further, since a gate voltage of the input-stage transistor 145 of the eighth differential pair 158 is equal to the drain voltage $v_{o6}$ of the input-stage transistor 139 of the sixth differential pair 156, a drain current $i_{o8}$ of the input-stage transistor 145 of the eighth differential pair 158 has a value proportional to the sine wave sin θ, as expressed by the following expression (13).

[expression 13]

$$g_{m8} = g_{m6} = \sqrt{k}$$

$$i_{o8} = -g_{m8} \cdot v_{o6} = -Z_{o6} \cdot k \cdot \sin\theta \quad (13)$$

Here, since the drain of the input-stage transistor 141 of the seventh differential pair 157 and the drain of the input-stage transistor 145 of the eighth differential pair 158 are connected by the first output terminal O_CLK, the seventh differential pair 157 and the eighth differential pair 158 add the current $i_{o7}$ of the seventh differential pair 157 and the current $i_{o8}$ of the eighth differential pair 158 to output, to the first output terminal O_CLK, a current $i_{o7}+i_{o8}$ proportional to sin θ·sin α, as expressed by the following expression (14).

[expression 14] \quad (14)

$$\begin{aligned} i_{o7} + i_{o8} &= Z_{o5} \cdot k \cdot (1 + \sin\alpha) \cdot \sin\theta - Z_{o6} \cdot k \cdot \sin\theta \\ &= Z_{o1} \cdot k \cdot \sin\alpha \cdot \sin\theta \end{aligned}$$

At the first output terminal O_CLK, the output current $i_{o3}+i_{o4}$ of the third differential pair 153 and the fourth differential pair 154 and the output current $i_{o7}+i_{o8}$ of the seventh differential pair 157 and the eighth differential pair 158 are added, and a current proportional to cos(θ−α) flows according to the addition theorem of the trigonometric function as expressed by the expression (1). As described above, the mixer 101 is capable of outputting the signal with the cosine wave cos(θ−α) according to the phase α indicated by the phase control signal CTL.

The loads of the first differential pair 151 are the parallel-connection circuits of the current sources 111, 112 in which the current proportional to the tail current of the first differential pair 151 flows and the resistors 113, 114. The loads of the fifth differential pair 155 are the parallel-connection circuits of the current sources 129, 130 in which the current proportional to the tail current of the fifth differential pair 155 flows and the resistors 131, 132. Parallel-connection circuits of the current sources 147, 148 in which the current proportional to the sum of the tail current of the third differential pair 153 and the tail current of the seventh differential pair 157 flows and the resistors 149, 150 are connected to the first output terminal O_CLK and the second output terminal O_CLKX respectively.

In the tail current sources 117, 122, 125, 128, 135, 140, 143, 146 of the first to eighth differential pairs 151 to 158, the currents $I_{11}, I_{12}, I_{13}$ proportional to reciprocals of respective βs of the input-stage transistors of the first to eighth differential pairs 151 to 158 flow. βs of the input-stage transistors of the first to eighth differential pairs 151 to 158 are all equal. That is, the input-stage transistors of the first to eighth differential pairs 151 to 158 are mutually equal in channel kind, channel width, and channel length.

FIG. 2 is a diagram illustrating a configuration example of the bias generator 102 in FIG. 1. First, the structure of the constant current generation circuit 104 will be described. A p-channel field effect transistor Ma has a source connected to the power supply potential node and a gate and a drain connected to the ground potential node via a current source 201. In the current source 201, a current $I_{ref}$ flows. A p-channel field effect transistor Mb has a source connected to the power supply potential node and a gate connected to the gate of the transistor Ma. The transistors Ma and Mb constitute a current mirror circuit, and their current mirror ratio (size ratio) is Ma:Mb=1:k/β. An n-channel field effect transistor Mc has a drain and a gate connected to a drain of the transistor Mb and a source connected to the ground potential node. An n-channel field effect transistor Md has a drain connected to a node N3, a gate connected to the gate of the transistor Mc, and a source connected to the ground potential node. The transistors Mc and Md constitute a current mirror circuit, and their current mirror ratio (size ratio) is Mc:Md=1:1. A drain current $I_d$ of the transistor Mb and a drain current $I_d$ of the transistor Md are the same current. The node N3 outputs the bias signal B3 in FIG. 1.

Next, the structures of the sin α current generation circuit 105 and the cos α current generation circuit 106 will be described. The control circuit 107 outputs a first control signal S1 according to the phase control signal CTL. A p-channel field effect transistor M1 has a source connected to the power supply potential node and a gate and a drain connected to the ground potential node via a current source 202. In the current source 202, a current $I_a$ flows. A p-channel field effect transistor M2 has a source connected to the power supply potential node and a gate connected to the gate of the transistor M1. The transistors M1 and M2 constitute a current mirror circuit, and their current mirror ratio (size ratio) is controlled to M1:M2=1:m according to the first control signal S1. m is a coefficient proportional to the desired shift angle α, and m=s·α. s is an arbitrary constant Concretely, by changing a size of a channel width (number of parallel connections) of the transistor M2 according to the first control signal S1, the current mirror ratio is changed.

An n-channel field effect transistor M3 has a drain and a gate connected to a drain of the transistor M2 and a source connected to the ground potential node. An n-channel field effect transistor M4 has a drain connected to a drain of a p-channel field effect transistor M5, a gate connected to the gate of the transistor M3, and a source connected to the ground potential node. The transistors M3 and M4 constitute a current mirror circuit, and their current mirror ratio (size ratio) is controlled to M3:M4=1:m according to the first control signal S1.

The p-channel field effect transistor M5 has a source connected to the power supply potential node and a gate and the drain connected to the drain of the transistor M4. A p-channel field effect transistor M6 has a source connected to the power supply potential node, a gate connected to the gate of the transistor M5, and a drain connected to the ground potential node via a current source 203. In the current source 203, a current $I_b$ flows. The transistors M5 and M6 constitute a current mirror circuit, and their current mirror ratio (size ratio) is M5:M6=1:½.

A p-channel field effect transistor M7 has a source connected to the power supply potential node and a gate and a drain connected to the ground potential node via the current source 203. A p-channel field effect transistor M8 has a source connected to the power supply potential node, a gate connected to the gate of the transistor M7, and a drain connected to a node N2. The transistors M7 and M8 constitute a current mirror circuit, and their current mirror ratio (size ratio) is M7:M8=1:1. A current source 204 is connected between the power supply potential node and the node N2, and the current $I_b$ flows therein. The node N2 is an output terminal of the cos α current generation circuit 106 in FIG. 1 and outputs the cos α current. Details thereof will be described later.

A p-channel field effect transistor M9 has a source connected to the power supply potential node, a gate connected to the gate of the transistor M5, and a drain connected to the ground potential node via a current source 205. In the current source 205, the current $I_b$ flows. The transistors M5 and M9 constitute a current mirror circuit, and their current mirror ratio (size ratio) is M5:M9=1:⅙.

A p-channel field effect transistor M10 has a source connected to the power supply potential node and a gate and a drain connected to the ground potential node via the current source 205. A p-channel field effect transistor M11 has a source connected to the power supply potential node, a gate connected to the gate of the transistor M10, and a drain connected to a node N1. The transistors M10 and M11 constitute a current mirror circuit, and their current mirror ratio (size ratio) is controlled to M10:M11=1:m according to the first control signal S1. A current source 206 is connected between the power supply potential node and the node N1 and a current $I_c$ flows therein. The node N1 is an output terminal of the sin α current generation circuit 105 in FIG. 1 and outputs the sin α current. Details thereof will be described later.

Here, ratios of the currents $I_a$, $I_b$, and $I_c$ to the drain current $I_d$ of the transistor Mb are as expressed by the following expression (A1).

$$I_a:I_b:I_c=I_d:s^2 \cdot I_d:s^3 \cdot I_d \quad (A1)$$

cos α and sin α can be expressed by the following expressions (15) when expressed up to a second term of the Taylor series of the trigonometric function.

[expression 15]

$$\cos\alpha \cong 1 - \frac{1}{2}\alpha^2 \quad (15)$$

$$\sin\alpha \cong \alpha\left(1 - \frac{1}{6}\alpha^2\right)$$

First, an operation of the constant current generation circuit 104 will be described. The current mirror ratio of the transistors Ma and Mb is 1:k/β, and therefore, when the reference current $I_{ref}$ flows in the current source 201 by a band gap reference circuit or the like, the drain current $I_d$ of the transistor Mb becomes a current proportional to the reciprocal of β and k as expressed by the following expression (16). Here, k and β have the same values as those of the aforesaid k and β. In the node N3, the current $I_d$ flows. The current $I_d$ corresponds to the bias signal B3 in FIG. 1.

[expression 16]

$$I_d = \frac{k}{\beta}I_{ref} \propto \frac{k}{\beta} \quad (16)$$

Next, the sin α current generation circuit 105 and the cos α current generation circuit 106 will be described. In the current source 202, the current $I_a$ flows. Since the current mirror ratio of the transistors M1 and M2 is 1:m and the current mirror ratio of the transistors M3 and M4 is 1:m, a drain current $I_1$ of the transistor M4 is expressed by the following expression (17). Since the current $I_1$ also flows in the drain of the transistor M5 and the current mirror ratio of the transistors M5 and M6 is 1:½, a drain current $I_2$ of the transistor M6 is expressed by the following expression (17). Further, a drain current $I_3$ of the transistor M7 becomes a current equal to the current $I_b$ from which the current $I_2$ is subtracted as expressed by the following expression (17). Further, since the current mirror ratio of the transistors M7 and M8 is 1:1, the current $I_3$ also flows in the drain of the transistor M8. Further, an output current $I_4$ of the node N2 becomes a current equal to the sum of the current $I_3$ and the current $I_b$ as expressed by the following expression (17).

[expression 17]

$$I_1 = m^2 \cdot I_a = s^2 \cdot \alpha^2 I_a \quad (17)$$

$$I_2 = \frac{1}{2} \cdot I_1 = s^2 \cdot \frac{1}{2}\alpha^2 I_a$$

$$I_3 = I_b - I_2 = I_b - s^2 \cdot \frac{1}{2}\alpha^2 I_a$$

$$I_4 = I_b + I_3 = I_b + I_b - s^2 \cdot \frac{1}{2}\alpha^2 I_a$$

Here, since a ratio of the currents $I_a$ and $I_b$ is $I_a:I_b=I_d:s^2 \cdot I_d$, the current with the cosine value cos α approximated up to the second term of the Taylor series flows as the current $I_4$, as expressed by the expression (15). The node N2 corresponds to the output terminal of the cos α current generation circuit 106 in FIG. 1 and outputs the current $I_4$ with the cosine value cos α.

Further, since the current mirror ratio of the transistors M5 and M9 is 1:⅙, a drain current $I_5$ of the transistor M9 is expressed by the following expression (18). Further, a drain current $I_6$ of the transistor M10 becomes a current equal to the current $I_b$ from which the current $I_5$ is subtracted as expressed by the following expression (18). Further, since the current mirror ratio of the transistors M10 and M11 is 1:m, a drain current $I_7$ of the transistor M11 is expressed by the following expression (18). Further, an output current $I_8$ of the node N1 becomes a current equal to the sum of the current $I_7$ and the current $I_c$ as expressed by the following expression (18).

[expression 18]

$$I_5 = \frac{1}{6} \cdot I_1 = s^2 \cdot \frac{1}{6}\alpha^2 I_a \quad (18)$$

$$I_6 = I_b - I_5 = I_b - s^2 \cdot \frac{1}{6}\alpha^2 I_a$$

$$I_7 = m \cdot I_5 = 2 \cdot \alpha I_b - s^3 \cdot \frac{1}{6}\alpha^3 I_a$$

$$I_8 = I_c + I_7 = I_c + s \cdot \alpha I_b - s^3 \cdot \frac{1}{6}\alpha^3 I_a$$

Here, since the ratio of the currents $I_a$, $I_b$, and $I_c$ is $I_a:I_b:I_c=I_d:s^2 \cdot I_d:s^3 \cdot I_d$, the current with the sine value sin α approximated up to the second term of the Taylor series flows as the current $I_8$, as expressed by the expression (1). The node N1 corresponds to the output terminal of the sin α current generation circuit 105 in FIG. 1 and outputs the current $I_8$ with the sine value sin α.

Next, concrete examples of the currents $I_a$, $I_b$, and $I_c$ will be described. As described above, the ratio of the currents $I_a$, $I_b$, and $I_c$ is $I_a:I_b:I_c=I_d:s^2 \cdot I_d:s^3 \cdot I_d$. Hereinafter, an example where the currents $I_a$, $I_b$, and $I_c$ are expressed by the following expressions (19) will be described.

[expression 19]

$$I_a = I_d$$

$$I_b = s^2 \cdot I_d$$

$$I_c = s^3 \cdot I_d \qquad (19)$$

In this case, the output current $I_4$ of the node N2 becomes a current proportional to $(1+\cos \alpha)$ as expressed by the following expression (20) by applying the approximation of the expression (15).

[expression 20]

$$\begin{aligned} I_4 &= I_b + I_b - s^2 \cdot \frac{1}{2}\alpha^2 I_a \\ &= s^2 I_d + s^2 I_d - s^2 \cdot \frac{1}{2}\alpha^2 I_d \\ &= s^2 I_d \left(1 + 1 - \frac{1}{2}\alpha^2\right) \\ &\cong s^2 I_{ref} \cdot \frac{k}{\beta}(1 + \cos\alpha) \end{aligned} \qquad (20)$$

Further, the output current $I_8$ of the node N1 becomes a current proportional to $(1+\sin \alpha)$ as expressed by the following expression (21) by applying the approximation of the expression (15).

[expression 21]

$$\begin{aligned} I_8 &= I_c + s \cdot \alpha I_b - s^3 \cdot \frac{1}{6}\alpha^3 I_a \\ &= s^3 \cdot I_d + s^3 \cdot \alpha I_d - s^3 \cdot \frac{1}{6}\alpha^3 I_d \\ &= s^3 \cdot I_d \left(1 + \alpha - \frac{1}{6}\alpha^3\right) \\ &= s^3 \cdot I_d \left(1 + \alpha\left(1 - \frac{1}{6}\alpha^2\right)\right) \\ &\cong s^3 I_{ref} \cdot \frac{k}{\beta}(1 + \sin\alpha) \end{aligned} \qquad (21)$$

Next, an example where the currents $I_a$, $I_b$, and $I_c$ are expressed by the following expressions (22) will be described.

[expression 22]

$$I_a = \frac{1}{s^2} I_d$$

$$I_b = I_d$$

$$I_c = s \cdot I_d \qquad (22)$$

In this case, the output current $I_4$ of the node N2 is expressed by the following expression (23), and by applying the approximation of the expression (15), it becomes a current proportional to $(1+\cos \alpha)$.

[Expression 23]

$$\begin{aligned} I_4 &= I_b + I_b - s^2 \cdot \frac{1}{2}\alpha^2 I_a \\ &= I_d + I_d - \frac{1}{2}\alpha^2 I_d \\ &= I_d\left(1 + 1 - \frac{1}{2}\alpha^2\right) \\ &\cong I_{ref} \cdot \frac{k}{\beta}(1 + \cos\alpha) \end{aligned} \qquad (23)$$

Further, the output current $I_8$ of the node N1 is expressed by the following expression (24) and becomes a current proportional to $(1+\sin \alpha)$ by applying the approximation of the expression (15).

[expression 24]

$$\begin{aligned} I_8 &= I_c + s \cdot \alpha I_b - s^3 \cdot \frac{1}{6}\alpha^3 I_a \\ &= s \cdot I_d + s \cdot \alpha I_d - s \cdot \frac{1}{6}\alpha^3 I_d \\ &= s \cdot I_d\left(1 + \alpha - \frac{1}{6}\alpha^3\right) \\ &= s \cdot I_d\left(1 + \alpha\left(1 - \frac{1}{6}\alpha^2\right)\right) \\ &\cong s I_{ref} \cdot \frac{k}{\beta}(1 + \sin\alpha) \end{aligned} \qquad (24)$$

Here, the Taylor series of the trigonometric function of $\cos \alpha$ and $\sin \alpha$ are expressed by the following expressions (25).

[expression 25]

$$\begin{aligned} \cos\alpha &= 1 - \frac{1}{2!}\alpha^2 + \frac{1}{4!}\alpha^4 - \frac{1}{6!}\alpha^6 + \ldots \\ \sin\alpha &= \alpha - \frac{1}{3!}\alpha^3 + \frac{1}{5!}\alpha^5 - \frac{1}{7!}\alpha^7 + \ldots \end{aligned} \qquad (25)$$

In the above, the example of the circuits which generate the currents up to the second term of the Taylor series of the trigonometric function is presented, but the circuits can be circuits which generate currents of higher-order Taylor series of the trigonometric function.

Figure 3:
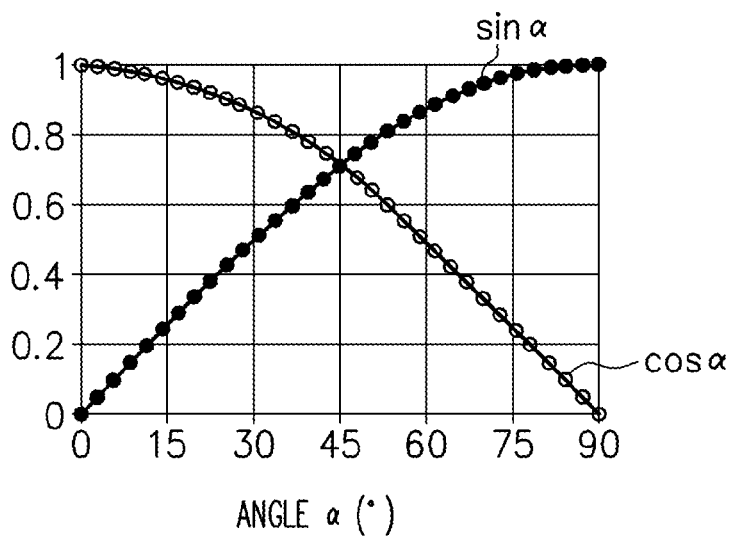
FIG. 3 is an explanatory chart of operations of the bias generator and a bias selector in FIG. 1.

FIG. 3 is an explanatory chart of operations of the bias generator 102 and the bias selector 103 in FIG. 1 and illustrates the sine value $\sin \alpha$ output by the $\sin \alpha$ current generation circuit 105 and the cosine value $\cos \alpha$ output by the $\cos \alpha$ current generation circuit 106.

First, a method how the bias selector 103 outputs the $\cos \alpha$ current will be described. $\sin \alpha$ in a range of $\alpha=0°$ to $45°$ and $\cos \alpha$ in a range of $\alpha=45°$ to $90°$ are in line symmetry with respect to a $45°$ axis. For example, $\cos 60°=\sin 30°$ and $\cos 75°=\sin 15°$. That is, in the range of $45°\leq\alpha<90°$, $\cos \alpha=\sin(90°-\alpha)$ holds. Therefore, in the range of $0°\leq\alpha<45°$, the $\cos \alpha$ current generation circuit 106 generates the current with the cosine value $\cos \alpha$, and the bias selector 103 outputs this current with the cosine value $\cos \alpha$. On the other hand, in the range of $45°\leq\alpha<90°$, the $\sin \alpha$ current generation circuit 105 generates a current with a sine value $\sin(90°-\alpha)$ ($=\cos \alpha$) and the bias selector 103 outputs this current with the sine value $\sin(90°-\alpha)$ ($=\cos \alpha$). That is, only the range of $0°\leq\alpha<45°$ is used.

Next, a method how the bias selector 103 outputs the sin α current will be described. cos α in the range of α=0° to 45° and sin α in the range of α=45° to 90° are in line symmetry with respect to the 45° axis. For example, sin 60°=cos 30° and sin 75°=cos 15°. That is, in the range of 45°≤α<90°, sin α=cos(90°−α) holds. Therefore, in the range of 0°≤α<45°, the sin α current generation circuit 105 generates the current with the sine value sin α, and the bias selector 103 outputs this current with the sine value sin α. On the other hand, in the range of 45°<α<90°, the cos α current generation circuit 106 generates a current with a cosine value cos(90°−α) (=sin α) and the bias selector 103 outputs this current with the cosine value cos(90°−α) (=sin α). That is, only the range of 0°≤α<45° is used.

First, a case where the range of the shift angle α is "0≤α<45°" will be described. The control circuit 107 in FIG. 2 outputs the first control signal S1 for setting m (=s·α) corresponding to the angle α when the angle α indicated by the phase control signal CTL is 0°≤α<45°. Consequently, the sin α current generation circuit 105 outputs the sin α current, and the cos α current generation circuit 106 outputs the cos α current. In this case, the bias selector 103 outputs the current with the sine value sin α as the bias signal B2, and outputs the current with the cosine value cos α as the bias signal B1.

Next, a case where the range of the shift angle α is "45°<α<90°" will be described. The control circuit 107 in FIG. 2 outputs the first control signal S1 for setting m (=s·(90°−α)) corresponding to an angle (90°−α) when the angle α indicated by the phase control signal CTL is 45°<α<90°. Consequently, the sin α current generation circuit 105 outputs the sin(90°−α) (=cos α) current, and the cos α current generation circuit 106 outputs the cos(90°−α) (=sin α) current. In this case, the bias selector 103 outputs the current with the cosine value sin(90°−α) (=cos α) as the bias signal B1, and outputs the current with the sine value cos(90°−α) (=sin α) as the bias signal B2.

Next, a case where the shift angle α is "45°" will be described. When α is 45°, sin α=cos α holds. Here, when the approximation orders of the Taylor series of sin α and cos α generated by the sin α current generation circuit 105 and the cos α current generation circuit 106 are the same, approximation accuracy of sin α is higher than that of cos α. Therefore, the sin α current generation circuit 105 is higher in accuracy than the cos α current generation circuit 106. Therefore, the control circuit 107 in FIG. 2 outputs the first control signal S1 for setting m (=s·α) corresponding to the angle α when the angle α indicated by the phase control signal CTL is 45°. Consequently, the sin α current generation circuit 105 outputs the sin α current. In this case, the bias selector 103 outputs the current with the sine value sin α and the current with the cosine value sin α (=cos α) as the bias signals B1 and B2.

As described above, the bias generator 102 does not generate sin α nor cos α in the range of 45°<α<90° and generates sin α and cos α only in the range of 0°≤α<45°. That is, since, owing to the first control signal S1, a size change range of the transistors M2, M4, and M11 is the narrow range of 0°≤α<45°, the maximum number of parallel connections of each of the transistors M2, M4, and M11 becomes small, which can reduce areas of the transistors M2, M4, and M11. That is, it is possible to reduce a circuit scale of the bias generator 102.

Figure 4:
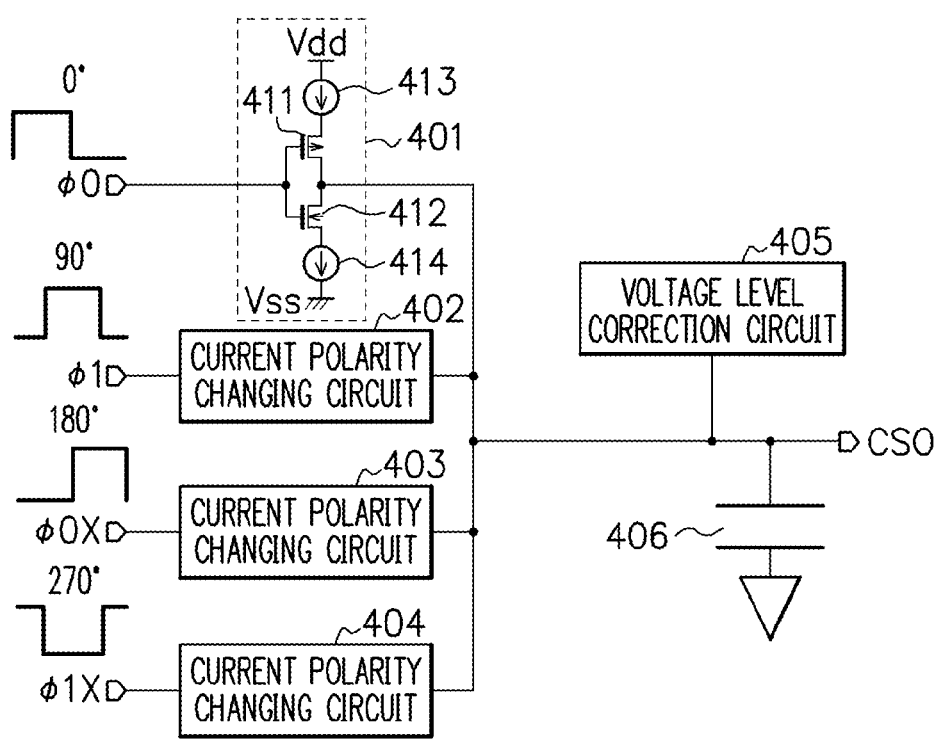
FIG. 4 is a diagram illustrating a configuration example of a phase interpolator to which four-phase square-wave signals are input.

Next, in order to explain the effect of the phase interpolator in FIG. 1, a phase interpolator in FIG. 4 will be described. FIG. 4 is a diagram illustrating a configuration example of a phase interpolator to which four-phase square-wave signals are input. Current polarity changing circuits 401 to 404 receive a 0° square-wave signal φ0, a 90° square-wave signal φ1, a 180° square-wave signal φ0X, and a 270° square-wave signal 41X respectively. The current polarity changing circuit 401 has field effect transistors 411, 412 and current sources 413, 414, and receives the 0° square-wave signal φ0 to output a triangular-wave signal to a capacitor 406. A voltage level correction circuit 405 is connected to the capacitor 406. The current polarity changing circuits 402 to 404 operate similarly to the current polarity changing circuit 401. At an output terminal CSO, the output signals of the current polarity changing circuits 401 to 404 are synthesized. By controlling currents flowing in the current sources 413, 414 of each of the current polarity changing circuits 401 to 404, it is possible to give weights to the 0° square-wave signal φ0, the 90° square-wave signal φ1, the 180° square-wave signal φ0X, and the 270° square-wave signal φ1X. Consequently, the output terminal CSO is capable of outputting a signal with a desired phase.

However, when frequencies of the square-wave input signals φ0, φ1, φ0X, φ1X are increased, the square-wave input signals φ0, φ1, φ0X, φ1X are distorted due to an influence of parasitic capacitance or the like existing in input wiring lines. When the distorted square-wave signals φ0, φ1, φ0X, φ1X are input to the phase interpolator, phase linearity of the phase interpolator deteriorates.

FIG. 5 is a chart illustrating a phase characteristic of the phase interpolator according to this embodiment. A characteristic 502 is a phase characteristic of the phase interpolator in FIG. 4, and because of the above reason, its phase linearity deteriorates. A characteristic 501 is the phase characteristic of the phase interpolator of this embodiment in FIG. 1 and almost matches ideal phase linearity. In this embodiment, by using the cosine wave or the sine wave instead of the square wave, it is possible to prevent the deterioration of the phase linearity even when the frequency of the signal is increased.

Second Embodiment

Figure 6:
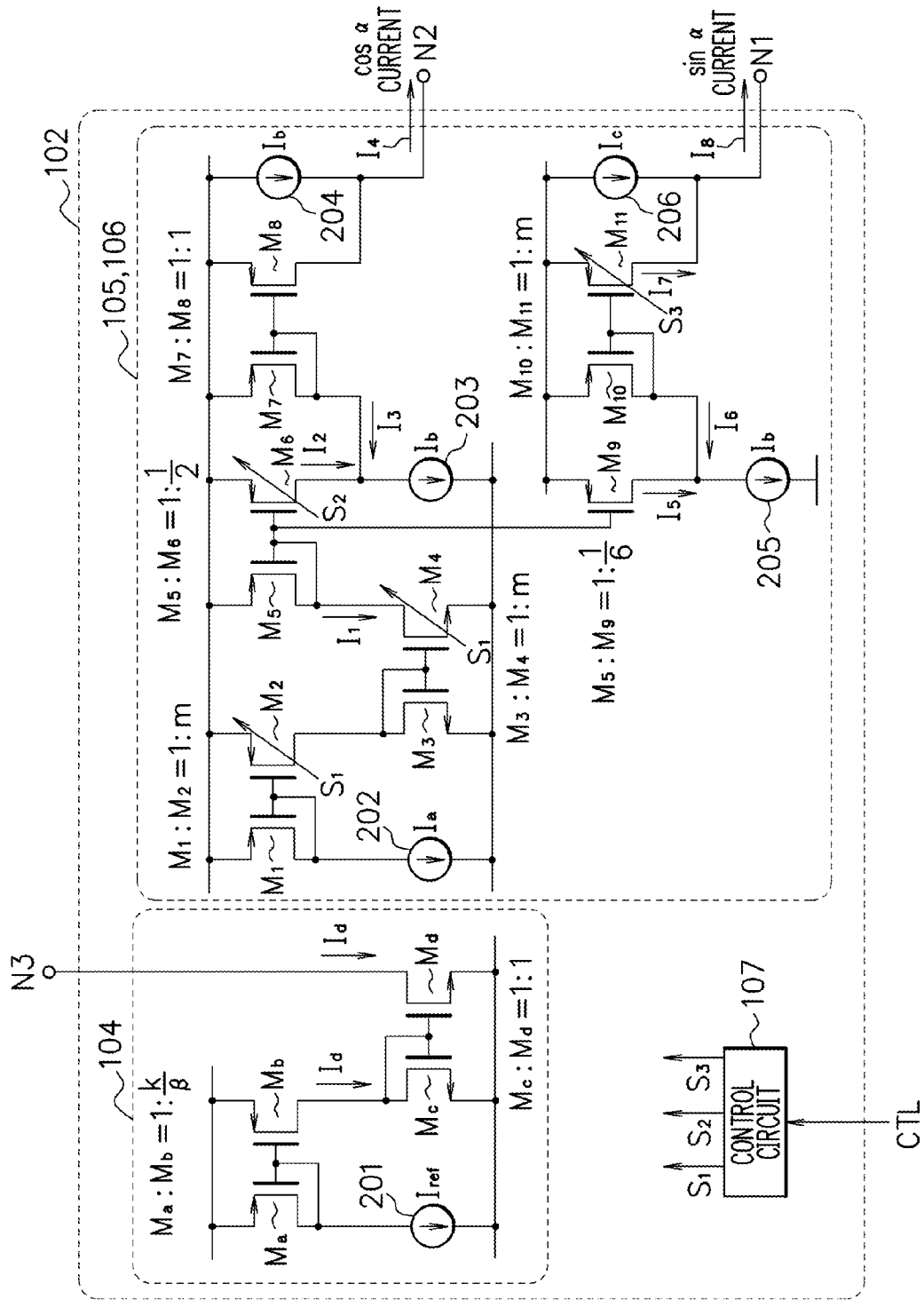
FIG. 6 is a diagram illustrating a configuration example of a bias generator according to a second embodiment.

FIG. 6 is a diagram illustrating a configuration example of a bias generator 102 according to a second embodiment. Hereinafter, differences of this embodiment (FIG. 6) from the first embodiment (FIG. 2) will be described. A control circuit 107 outputs a first control signal S1, a second control signal S2, and a third control signal S3 according to a phase control signal CTL. A size of a transistor M6 is controlled according to the second control signal S2. That is, a current mirror ratio of a transistor M5 and the transistor M6 is controlled according to the second control signal S2. A size of a transistor M11 is controlled according to the third control signal S3. That is, a current mirror ratio of a transistor M10 and the transistor M11 is controlled according to the third control signal S3.

When a desired shift angle α is 0°<α<90°, the size of the transistor M6 is controlled to ½ of of a size of the transistor M5, and the size of the transistor M11 is controlled to m times a size of the transistor M10. Further, as a size ratio m of each of transistors M2, M4, M11, a value proportional to the desired shift angle α is selected as in the first embodiment. In this case, an operation in this embodiment is the same as that of the first embodiment.

When the desired shift angle α is 00, a size of the transistor M2 is controlled to the same size as that of a transistor M1 (M1:M2=1:1), and a size of the transistor M4 is controlled to the same size as that of a transistor M3 (M3:M4=1:1). Further, the sizes of the transistors M6 and M11 are set to 0. That is, gates of the transistors M6 and M11 are disconnected from gates of the transistors M5 and M10 respectively. The transistor M6 becomes off, a drain current $I_2$ of the transistor M6 becomes 0, and an output current $I_4$ of a node N2 becomes a current proportional to (1+cos 0°). Further, the transistor M11 becomes off, a drain current $I_7$ of the transistor M11 becomes 0, and an output current $I_8$ of a node N1 becomes a current proportional to (1+sin 0°).

Consequently, whatever value the angle α indicated by the phase control signal CTL has, a voltage in the bias generator 102 is not fixed to a power supply potential or a ground potential, and consequently, a response of an output to the phase control signal CTL becomes quick.

Incidentally, the transistors whose sizes are controlled are not limited to the aforesaid transistors M6 and M11. When the desired shift angle α is 0°, a gate of a transistor M7 or M8 instead of the transistor M6 may be disconnected, and a gate of a transistor M9 or the transistor M10 instead of the transistor M11 may be disconnected.

As described above, a current mirror ratio of a current mirror circuit of the transistors M1 and M2 and a current mirror ratio of a current mirror circuit of the transistors M3 and M4 are controlled according to the first control signal S1.

Further, a current mirror circuit of the transistors M5 and M6 and so on is connected to a subsequent stage of the current mirror circuit of the transistors M1 and M2 and the current mirror circuit of the transistors M3 and M4, and its current mirror ratio is controlled according to the second control signal S2 in order to generate a current with a cosine value cos α.

Further, a current mirror circuit of the transistors M10 and M11 and so on is connected to a subsequent stage of the current mirror circuit of the transistors M1 and M2 and the current mirror circuit of the transistors M3 and M4, and its current mirror ratio is controlled according to the third control signal S3 in order to generate a current with a sine value sin α.

Third Embodiment

Figure 7:
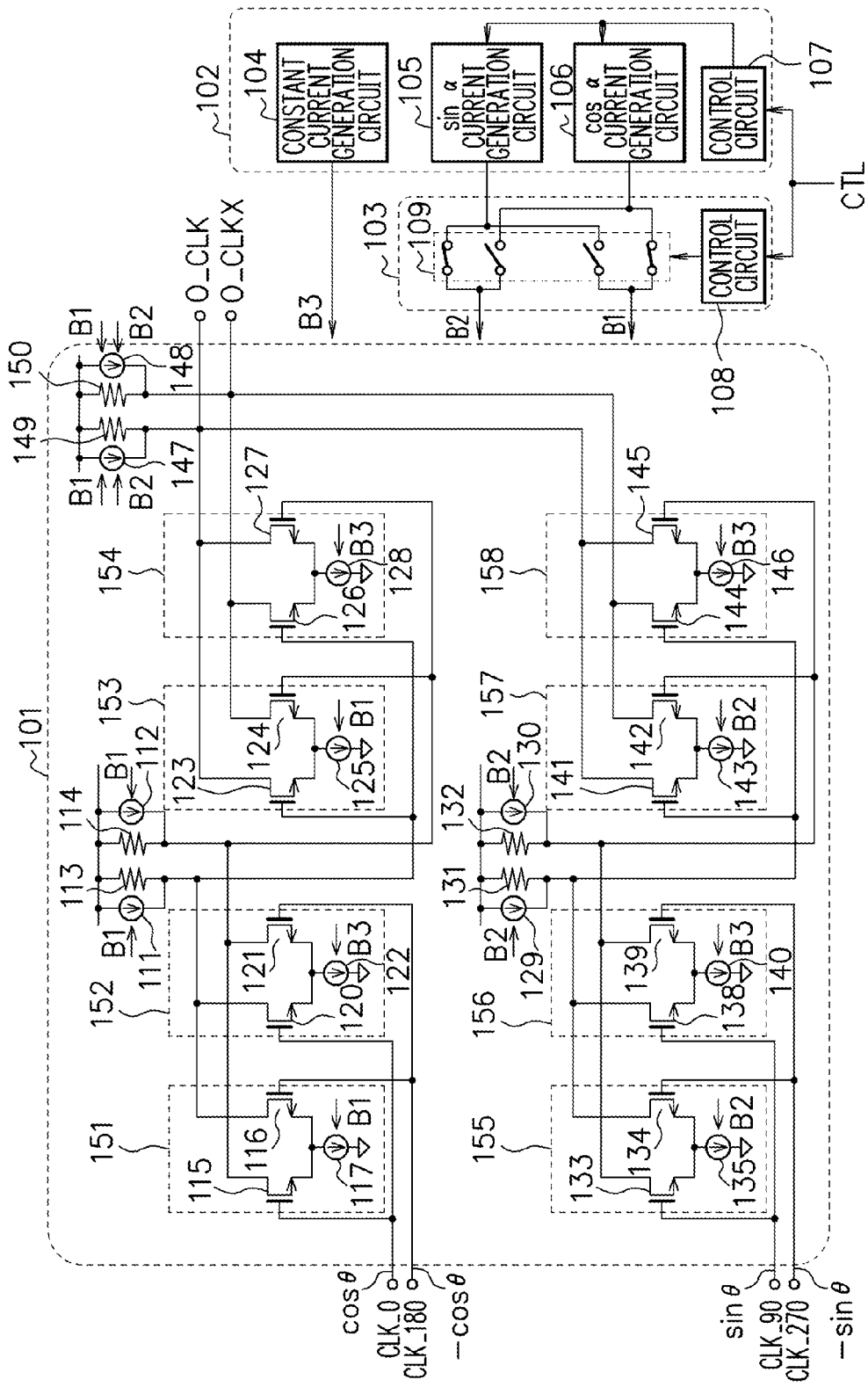
FIG. 7 is a diagram illustrating a configuration example of a phase interpolator according to a third embodiment.

FIG. 7 is a diagram illustrating a configuration example of a phase interpolator according to a third embodiment. In this embodiment (FIG. 7), the resistors 118, 119, 136, 137 are deleted from the first embodiment (FIG. 1). Hereinafter, differences of this embodiment (FIG. 7) from the first embodiment (FIG. 1) will be described A drain of a transistor 116 and a drain of a transistor 120 are connected to each other and are connected to a power supply potential node via a parallel-connection circuit of a current source 111 and a resistor 113. A drain of a transistor 115 and a drain of a transistor 121 are connected to each other and are connected to the power supply potential node via a parallel-connection circuit of a current source 112 and a resistor 114.

A drain of a transistor 134 and a drain of a transistor 138 are connected to each other and are connected to the power supply potential node via a parallel-connection circuit of a current source 129 and a resistor 131. A drain of a transistor 133 and a drain of a transistor 139 are connected to each other and are connected to the power supply potential node via a parallel-connection circuit of a current source 130 and a resistor 132.

A first differential pair 151 and a second differential pair 152 are commonly connected to a first load. The first load is the parallel-connection circuits of the current sources 111, 112 and the resistors 113, 114. A fifth differential pair 155 and a sixth differential pair 156 are commonly connected to a second load. The second load is the parallel-connection circuits of the current sources 129, 130 and the resistors 131, 132.

The output loads of the first differential pair 151 and the second differential pair 152 become common, and the output loads of the fifth differential pair 155 and the sixth differential pair 156 become common. Since the loads become common, a circuit scale can be reduced.

Next, operations of the first differential pair 151 to a fourth differential pair 154 will be described. A tail current $I_{11}$ expressed by the following expression (26) flows in each of tail current sources 117 and 125. Further, a tail current $I_{12}$ expressed by the following expression (26) flows in each of tail current sources 122 and 128.

[expression 26]

$$I_{11} = \frac{k}{\beta}(1 + \cos\alpha) \tag{26}$$

$$I_{12} = \frac{k}{\beta}$$

Mutual conductance $g_{m1}$ of the input-stage transistor 115 of the first differential pair 151 has a value correlated with a cosine value cos α of a desired shift angle α as expressed by the following expression (27). Since a cosine wave cos θ is input to a gate of the input-stage transistor 115 of the first differential pair 151, a drain current $i_{o1}$ of the input-stage transistor 115 has a value equal to a square root of the cosine value cos α of the desired shift angle α multiplied by the cosine wave cos θ as expressed by the following expression (27).

[expression 27]

$$g_{m1} = \sqrt{2\beta \cdot \frac{I_{11}}{2}} = \sqrt{\beta \cdot I_{11}} = \sqrt{k(1 + \cos\alpha)} \tag{27}$$

$$i_{o1} = -g_{m1} \cdot v_{in} = -\sqrt{k(1 + \cos\alpha)} \cdot \cos\theta$$

The current $I_{12}$ expressed by the above expression (26) flows in the tail current source 122 of the second differential pair 152. Therefore, since a bias current $I_{12}/2$ flows in the input-stage transistor 121 of the second differential pair 152, mutual conductance $g_{m2}$ of the input-stage transistor 121 of the second differential pair 152 has a value equal to a square root of an arbitrary constant k as expressed by the following expression (28). Further, a drain current $i_{o2}$ of the input-stage transistor 121 of the second differential pair 152 is expressed by the following expression (28).

[expression 28]

$$g_{m2} = \sqrt{2\beta \cdot \frac{I_{12}}{2}} = \sqrt{\beta \cdot I_{12}} = \sqrt{k} \tag{28}$$

$$i_{o2} = -g_{m2} \cdot v_{in} = \sqrt{k} \cdot \cos\theta$$

Output nodes of the first differential pair 151 and the second differential pair 152 are connected to the common load. Therefore, drain voltages $v_{o1}$ of the input-stage transistor 115 of the first differential pair 151 and the input-stage transistor 121 of the second differential pair 152 are equal, and they have a value equal to a current $i_{o1}+i_{o2}$ being the sum of the current $i_{o1}$ and the current $i_{o2}$, multiplied by an output impedance $Z_{o1}$, as expressed by the following expression (29).

[expression 29] (29)

$$\begin{aligned} v_{o1} &= Z_{o1} \cdot (i_{o1} + i_{o2}) \\ &= Z_{o1} \cdot \left( -\sqrt{k(1+\cos\alpha)} \cdot \cos\theta + \sqrt{k} \cdot \cos\theta \right) \\ &= Z_{o1} \cdot \sqrt{k} \left( -\sqrt{1+\cos\alpha} + 1 \right) \cdot \cos\theta \end{aligned}$$

Next, operations of the third differential pair 153 and the fourth differential pair 154 will be described. The same current $i_{11}$ as that of the tail current source 117 of the first differential pair 151 flows in the tail current source 125 of the third differential pair 153. Therefore, mutual conductance $g_{m3}$ of an input-stage transistor 124 of the third differential pair 153 has the same value as that of the mutual conductance $g_{m1}$ of the input-stage transistor 115 of the first differential pair 151 as expressed by the following expression (30). Further, since a gate voltage of the input-stage transistor 124 of the third differential pair 153 is equal to the drain voltage $v_{o1}$ of the input-stage transistor 115 of the first differential pair 151, a drain current $i_{o3}$ of the input-stage transistor 124 of the third differential pair 153 is expressed by the following expression (30).

[expression 30] (30)

$$\begin{aligned} g_{m3} &= g_{m1} = \sqrt{k(1+\cos\alpha)} \\ i_{o3} &= -g_{m3} \cdot v_{o1} \\ &= Z_{o1} \cdot k(1+\cos\alpha) \cdot \cos\theta - Z_{o1} k \sqrt{1+\cos\alpha} \cdot \cos\theta \end{aligned}$$

The same current $I_{12}$ as that of the tail current source 122 of the second differential pair 152 flows in the tail current source 128 of the fourth differential pair 154. Therefore, mutual conductance $g_{m4}$ of an input-stage transistor 127 of the fourth differential pair 154 has the same value as that of the mutual conductance $g_{m2}$ of the input-stage transistor 121 of the second differential pair 152 as expressed by the following expression (31). Further, since a gate voltage of the input-stage transistor 127 of the fourth differential pair 154 is equal to the drain voltage $v_{o1}$ of the input-stage transistor 115 of the first differential pair 151, a drain current $i_{o4}$ of the input-stage transistor 127 of the fourth differential pair 154 is expressed by the following expression (31).

[expression 31] (31)

$$\begin{aligned} g_{m4} &= g_{m2} = \sqrt{k} \\ i_{o4} &= -g_{m4} \cdot v_{o1} \\ &= Z_{o1} k \sqrt{1+\cos\alpha} \cdot \cos\theta - Z_{o1} k \cdot \cos\theta \end{aligned}$$

Since an output node of the third differential pair 153 and an output node of the fourth differential pair 154 are connected by output terminals O_CLK and O_CLKX, an output current of the output terminals O_CLK and O_CLKX is a current $i_{o3}+i_{o4}$ being the sum of the current $i_{o3}$ of the third differential pair 153 and the current $i_{o4}$ of the fourth differential pair 154 as expressed by the following expression (32), and as in the first embodiment, it becomes a current proportional to $\cos\theta \cdot \cos\alpha$. This also applies to the fifth differential pair 155 to an eighth differential pair 158.

[expression 32] (32)

$$\begin{aligned} i_{o3} + i_{o4} &= \\ &+Z_{o1} k(1+\cos\alpha) \cdot \cos\theta - Z_{o1} k\sqrt{1+\cos\alpha} \cdot \cos\theta \\ &-Z_{o1} \cdot k \cdot \cos\theta + Z_{o1} \cdot k \sqrt{1+\cos\alpha} \cdot \cos\theta \\ &= Z_{o1} \cdot k \cdot \cos\alpha \cos\theta \end{aligned}$$

Fourth Embodiment

Figure 8:
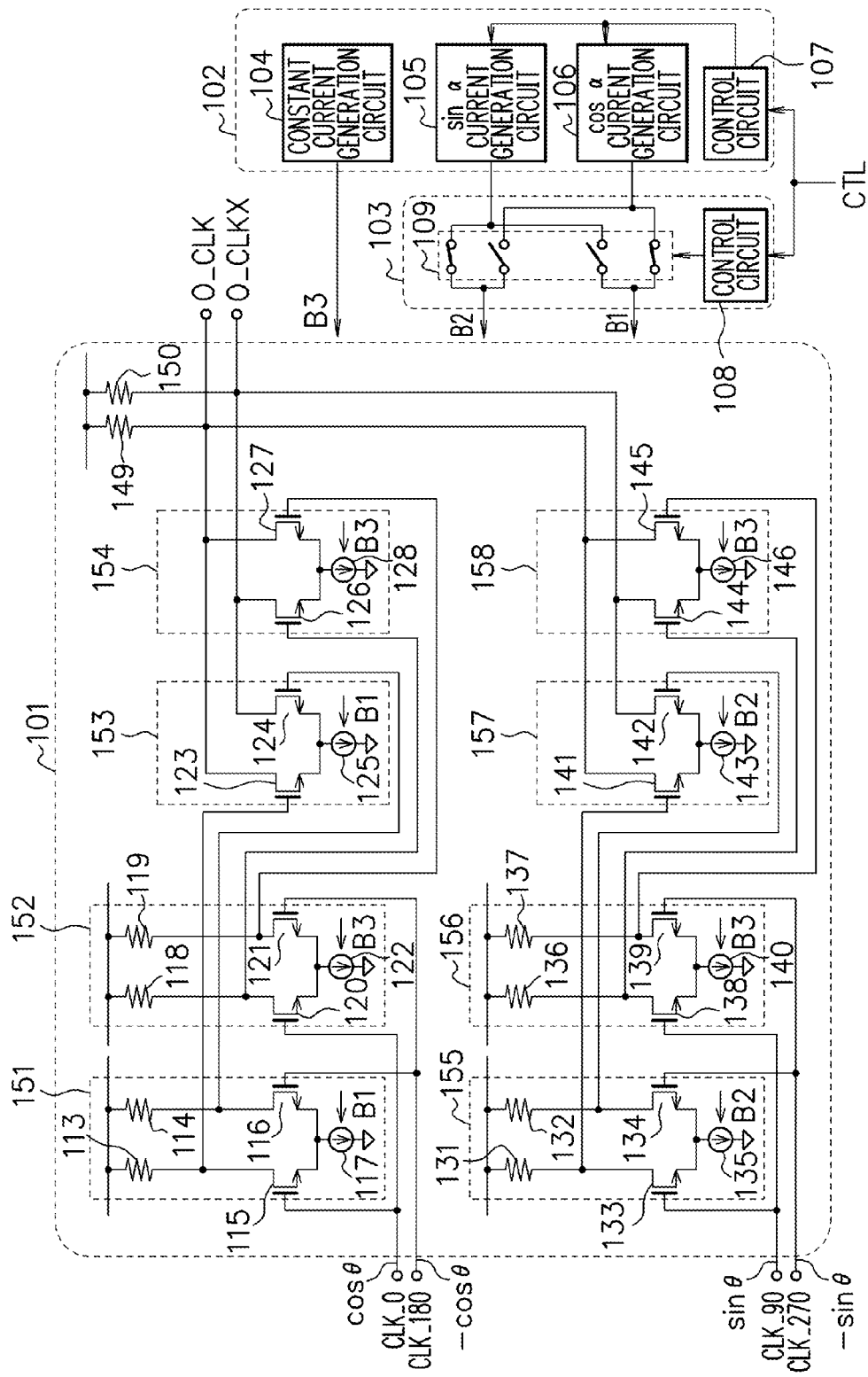
FIG. 8 is a diagram illustrating a configuration example of a phase interpolator according to a fourth embodiment.

FIG. 8 is a diagram illustrating a configuration example of a phase interpolator according to a fourth embodiment. In this embodiment (FIG. 8), the current sources 111, 112, 129, 130, 147, 148 are deleted from the first embodiment (FIG. 1). Hereinafter, differences of this embodiment (FIG. 8) from the first embodiment (FIG. 1) will be described.

A drain of a transistor 115 is connected to a power supply potential node via a resistor 113. A drain of a transistor 116 is connected to the power supply potential node via a resistor 114. A drain of a transistor 133 is connected to the power supply potential node via a resistor 131. A drain of a transistor 134 is connected to the power supply potential node via a resistor 132. A first output node O_CLK is connected to the power supply potential node via a resistor 149. A second output node O_CLKX is connected to the power supply potential node via a resistor 150. Loads of first to eighth differential pairs 151 to 158 are the resistors. The resistors being the loads of the first to eighth differential pairs 151 to 158 have resistance values proportional to βs of input-stage transistors of the first to eighth differential pairs 151 to 158 respectively.

According to this embodiment, the loads of the first to eight differential pairs 151 to 158 do not include current sources, and accordingly, parasitic capacitance components in output nodes of the first to eighth differential pairs 151 to 158 are smaller and a band becomes wider. Further, it is possible to make an output range of the output terminals O_CLK and O_CLKX wider.

Fifth Embodiment

Figure 9:
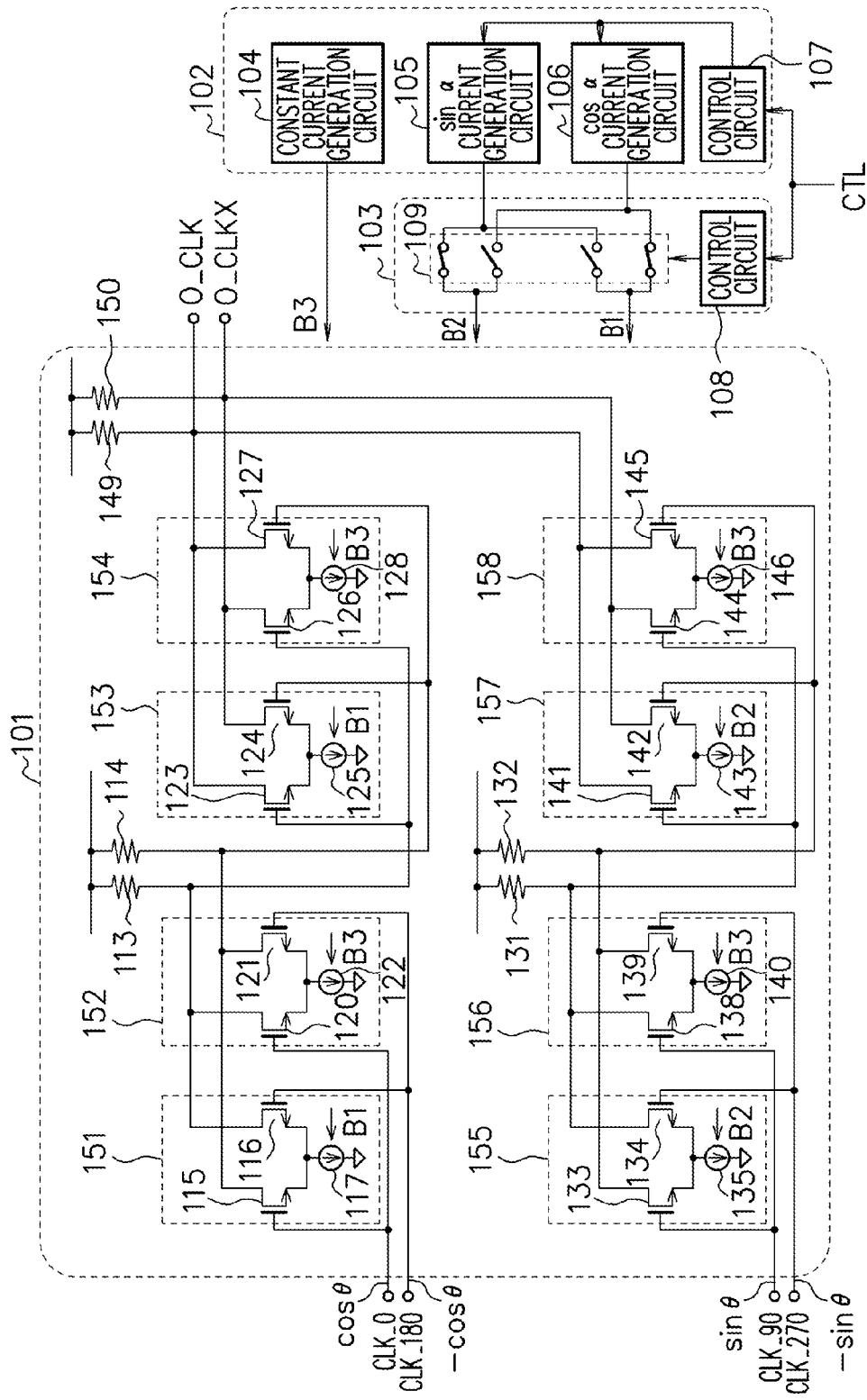
FIG. 9 is a diagram illustrating a configuration example of a phase interpolator according to a fifth embodiment.

FIG. 9 is a diagram illustrating a configuration example of a phase interpolator according to a fifth embodiment. In this embodiment (FIG. 9), the resistors 118, 119, 136, 137 are deleted from the fourth embodiment (FIG. 8). Hereinafter, differences of this embodiment (FIG. 9) from the fourth embodiment (FIG. 8) will be described.

A drain of a transistor 115 and a drain of a transistor 121 are connected to each other and are connected to a power supply potential node via a resistor 114. A drain of a transistor 116 and a drain of a transistor 120 are connected to each other and are connected to the power supply potential node via a resistor 113. A gate of a transistor 123 and a gate of a transistor 126 are connected to each other and are connected to a mutual connection point of the drains of the transistors 116 and 120. A gate of a transistor 124 and a gate of a transistor 127 are connected to each other and are connected to a mutual connection point of the drains of the transistors 115 and 121.

A drain of a transistor 133 and a drain of a transistor 139 are connected to each other and are connected to the power supply potential node via a resistor 132. A drain of a transistor 134 and a drain of a transistor 138 are connected to each other and are connected to the power supply potential node via a resistor 131. A gate of a transistor 141 and a gate of a transistor 144 are connected to each other and are connected to a mutual connection point of the drains of the transistors 134 and 138. A gate of a transistor 142 and a gate of a transistor 145 are connected to each other and are connected to a mutual connection point of the drains of the transistors 133 and 139.

A first differential pair 151 and a second differential pair 152 are commonly connected to a first load. The first load is the resistors 113 and 114. A fifth differential pair 155 and a sixth differential pair 156 are commonly connected to a second load. The second load is the resistors 131 and 132.

The output loads of the first differential pair 151 and the second differential pair 152 are common, and the output loads of the fifth differential pair 155 and the sixth differential pair 156 are common. Since the loads become common, it is possible to reduce a circuit scale.

Sixth Embodiment

Figure 10:
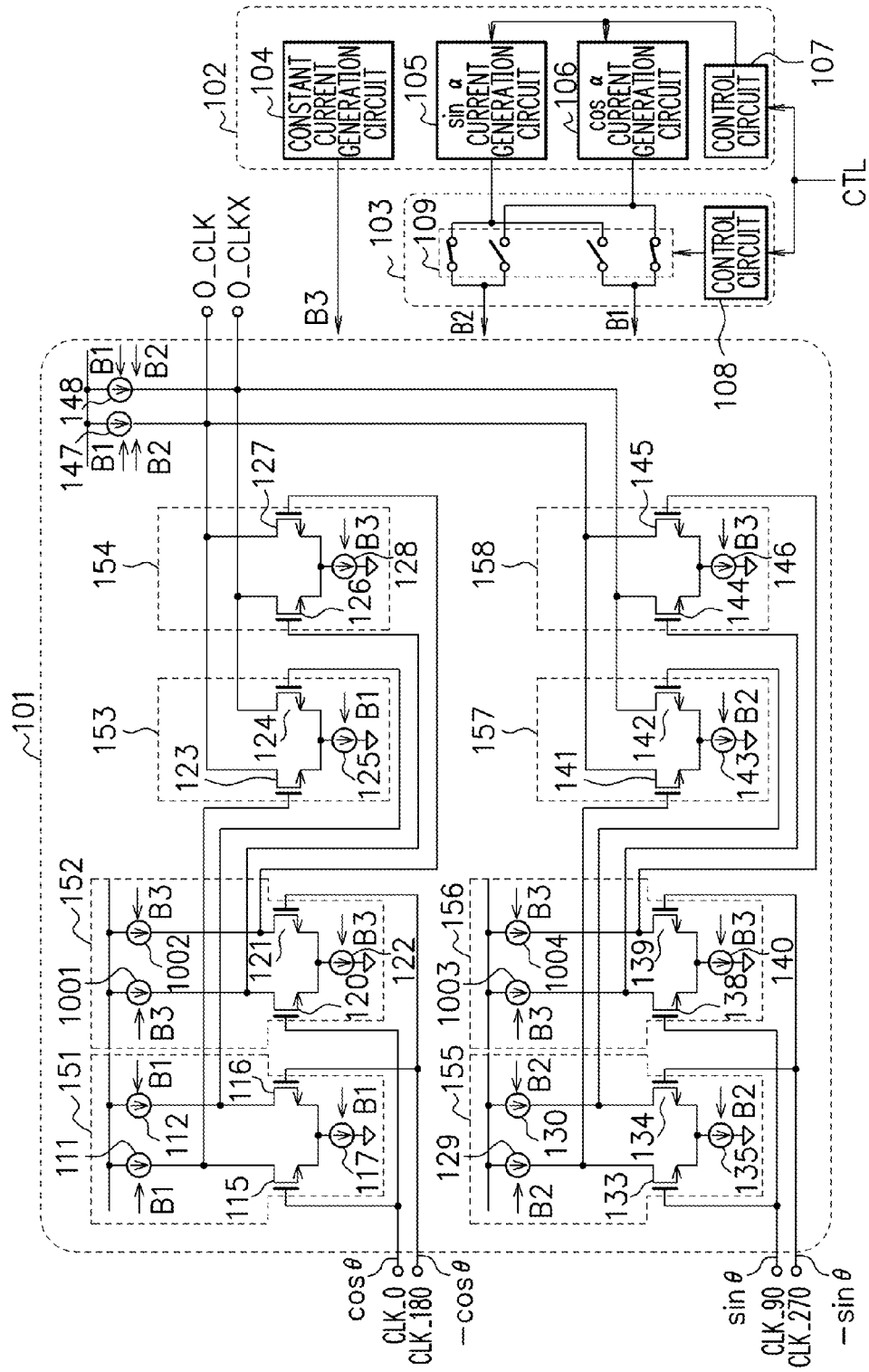
FIG. 10 is a diagram illustrating a configuration example of a phase interpolator according to a sixth embodiment.

FIG. 10 is a diagram illustrating a configuration example of a phase interpolator according to a sixth embodiment. In this embodiment (FIG. 10), the resistors 113, 114, 118, 119, 131, 132, 136, 137, 149, 150 are deleted from the first embodiment (FIG. 1) and current sources 1001 to 1004 are added thereto. Hereinafter, differences of this embodiment (FIG. 10) from the first embodiment (FIG. 1) will be described A drain of a transistor 115 is connected to a power supply potential node via a current source 111. A drain of a transistor 116 is connected to the power supply potential node via a current source 112. A drain of a transistor 120 is connected to the power supply potential node via the current source 1001. A drain of a transistor 121 is connected to the power supply potential node via the current source 1002. In each of the current sources 1001 and 1002, a current according to a bias signal B3 flows.

A drain of a transistor 133 is connected to the power supply potential node via a current source 129. A drain of a transistor 134 is connected to the power supply potential node via a current source 130. A drain of a transistor 138 is connected to the power supply potential node via the current source 1003. A drain of a transistor 139 is connected to the power supply potential node via the current source 1004. In each of the current sources 1003 and 1004, a current according to the bias signal B3 flows.

A first output terminal O_CLK is connected to the power supply potential node via a current source 147. A second output terminal O_CLKX is connected to the power supply potential node via a current source 148.

According to this embodiment, loads of first to eighth differential pairs 151 to 158 are the current sources. Since the current sources high in output resistance are the output loads of the differential pairs 151 to 158, it is possible to increase voltage gains of the differential pairs 151 to 158.

Seventh Embodiment

Figure 11:
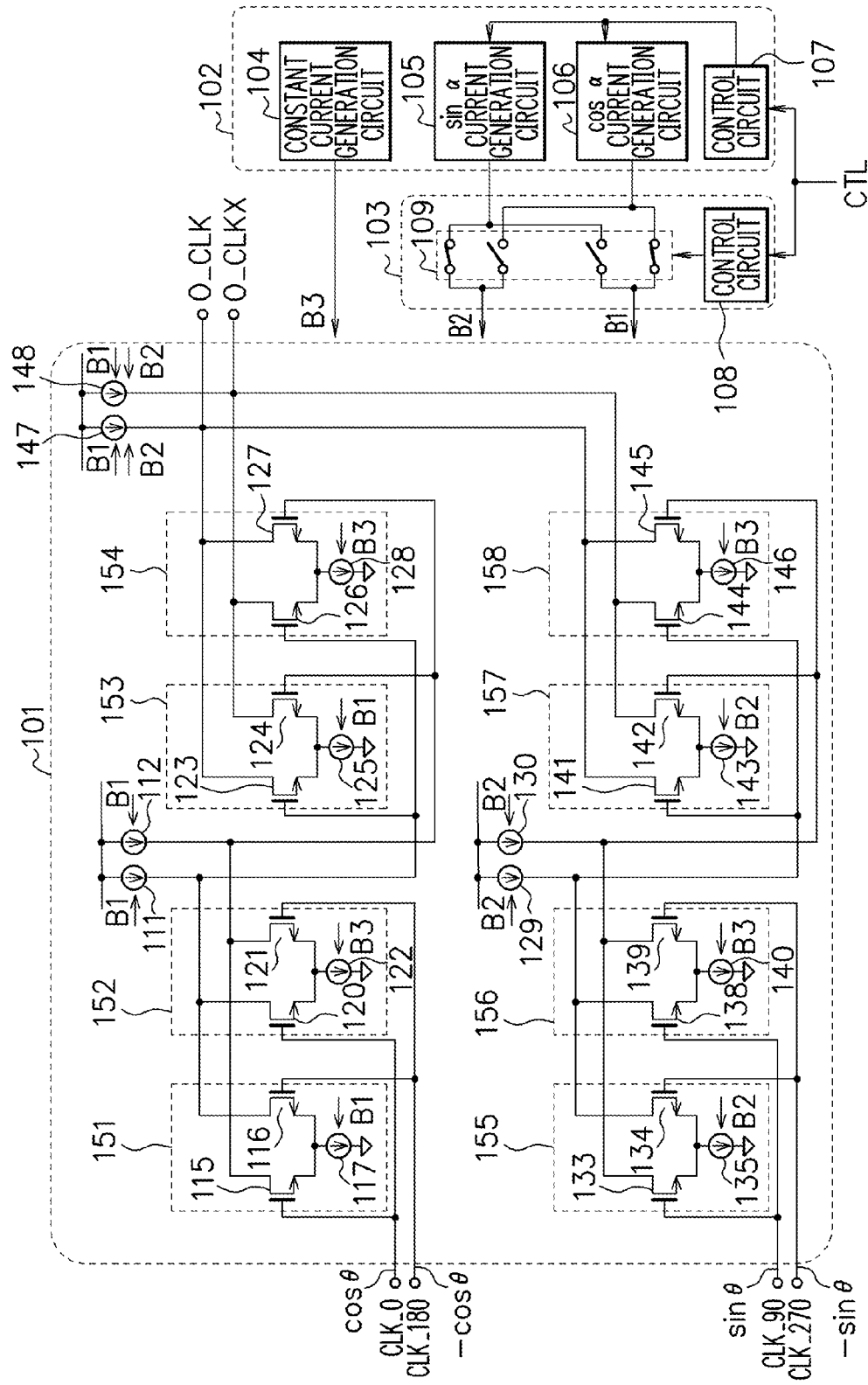
FIG. 11 is a diagram illustrating a configuration example of a phase interpolator according to a seventh embodiment.

FIG. 11 is a diagram illustrating a configuration example of a phase interpolator according to a seventh embodiment. In this embodiment (FIG. 11), the current sources 1001 to 1004 are deleted from the sixth embodiment (FIG. 10). Hereinafter, differences of this embodiment (FIG. 11) from the sixth embodiment (FIG. 10) will be described A drain of a transistor 115 and a drain of a transistor 121 are connected to each other and are connected to a power supply potential node via a current source 112. A drain of a transistor 116 and a drain of a transistor 120 are connected to each other and are connected to the power supply potential node via a current source 111. A gate of a transistor 123 and a gate of a transistor 126 are connected to each other and are connected to a mutual connection point of the drains of the transistors 116 and 120. A gate of a transistor 124 and a gate of a transistor 127 are connected to each other and are connected to a mutual connection point of the drains of the transistors 115 and 121.

A drain of a transistor 133 and a drain of a transistor 139 are connected to each other and are connected to the power supply potential node via a current source 130. A drain of a transistor 134 and a drain of a transistor 138 are connected to each other and are connected to the power supply potential node via a current source 129. A gate of a transistor 141 and a gate of a transistor 144 are connected to each other and are connected to a mutual connection point of the drains of the transistors 134 and 138. A gate of a transistor 142 and a gate of a transistor 145 are connected to each other and are connected to a mutual connection point of the drains of the transistors 133 and 139.

Output loads of a first differential pair 151 and a second differential pair 152 are common, and output loads of a fifth differential pair 155 and a sixth differential pair 156 are common. Since the loads become common, it is possible to reduce a circuit scale.

Note that the above-described embodiments all only present concrete examples in carrying out the present invention, and the technical scope of the present invention should not be construed in a limited manner by these. That is, the present invention can be embodied in various forms without departing from its technical idea or its main features.

By using a cosine wave or a sine wave instead of a square wave, it is possible to prevent deterioration of phase linearity even when a frequency of a signal is increased.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A phase interpolator comprising:
    a mixer configured to synthesize phases of a plurality of input cosine-wave or sine-wave signals whose phases are different from each other; and
    a bias generator configured to output a bias signal in accordance with a phase control signal to the mixer,
    wherein the mixer outputs a signal with a phase in accordance with the phase control signal, wherein the bias generator outputs the bias signal with a cosine value or a sine value having the phase in accordance with the phase control signal.

2. A phase interpolator comprising:
    a mixer configured to synthesize phases of a plurality of input cosine-wave or sine-wave signals whose phases are different from each other; and a bias generator configured to output a bias signal in accordance with a phase control signal to the mixer, wherein the mixer outputs a signal with a phase in accordance with the phase control signal, wherein:

the mixer has:

first to fourth input terminals to which four cosine-wave or sine-wave input signals whose phases are different from each other are input respectively;

first and second output terminals which each output a differential signal with the phase in accordance with the phase control signal;

a first differential pair to which the input signals of the first input terminal and the second input terminal are input;

a second differential pair to which the input signals of the first input terminal and the second input terminal are input;

a third differential pair to which an output signal of the first differential pair is input and which outputs a signal to the first output terminal and the second output terminal;

a fourth differential pair to which an output signal of the second differential pair is input and which outputs a signal to the second output terminal and the first output terminal;

a fifth differential pair to which the input signals of the third input terminal and the fourth input terminal are input;

a sixth differential pair to which the input signals of the third input terminal and the fourth input terminal are input;

a seventh differential pair to which an output signal of the fifth differential pair is input and which outputs a signal to the first output terminal and the second output terminal; and an eighth differential pair to which an output signal of the sixth differential pair is input and which outputs a signal to the second output terminal and the first output terminal;

the first differential pair, the third differential pair, the fifth differential pair, and the seventh differential pair each have a current source in which a current based on the bias signal with a cosine value or a sine value flows; and the second differential pair, the fourth differential pair, the sixth differential pair, and the eighth differential pair each have a current source in which a constant current flows.

3. The phase interpolator according to claim 2, wherein loads of the first to eighth differential pairs are resistors.

4. The phase interpolator according to claim 2, wherein:

a load of the first differential pair is a parallel-connection circuit of a current source in which a current proportional to a tail current of the first differential pair flows and a resistor;

a load of the fifth differential pair is a parallel-connection circuit of a current source in which a current proportional to a tail current of the fifth differential pair flows and a resistor; and parallel-connection circuits of current sources in which a current proportional to a sum of a tail current of the third differential pair and a tail current of the seventh differential pair flows and resistors are connected to the first and second output terminals respectively.

5. The phase interpolator according to claim 2, wherein:

the first differential pair and the second differential pair are connected commonly to a first load; and the fifth differential pair and the sixth differential pair are connected commonly to a second load.

6. The phase interpolator according to claim 5, wherein the first load and the second load are each a resistor.

7. The phase interpolator according to claim 5, wherein:

the first load is a parallel-connection circuit of a current source in which a current proportional to a tail current of the first differential pair flows and a resistor; and the second load is a parallel-connection circuit of a current source in which a current proportional to a tail current of the fifth differential pair flows and a resistor.

8. The phase interpolator according to claim 1, wherein the bias generator has a current mirror circuit, and a current mirror ratio of the current mirror circuit is controlled in accordance with the phase control signal.

9. A phase interpolator comprising:

a mixer configured to synthesize phases of a plurality of input cosine-wave or sine-wave signals whose phases are different from each other; and a bias generator configured to output a bias signal in accordance with a phase control signal to the mixer, wherein the mixer outputs a signal with a phase in accordance with the phase control signal, wherein the bias generator has:

a control circuit which outputs first to third control signals in accordance with the phase control signal;

a first current mirror circuit whose current mirror ratio is controlled in accordance with the first control signal;

a second current mirror circuit which is connected to a subsequent stage of the first current mirror circuit, whose current mirror ratio is controlled in accordance with the second control signal, and which generates a cosine value current; and a third current mirror circuit which is connected to a subsequent stage of the first current mirror circuit, whose current mirror ratio is controlled in accordance with the third control signal, and which generates a sine value current.

10. The phase interpolator according to claim 2, wherein:

the first to eighth differential pairs each have a tail current source; and in the tail current sources of the first to eighth differential pairs, currents proportional to reciprocals of gain coefficients $\beta$s of input-stage transistors of the first to eighth differential pairs flow respectively.

11. The phase interpolator according to claim 10, wherein the gain coefficients $\beta$s of the input-stage transistors of the first to eighth differential pairs are all equal.

12. The phase interpolator according to claim 3, wherein the resistors being the loads of the first to eighth differential pairs have resistance values proportional to gain coefficients $\beta$s of input-stage transistors of the first to eighth differential pairs respectively.

* * * * *